US012737658B2

(12) United States Patent
Schwaller et al.

(10) Patent No.: US 12,737,658 B2
(45) Date of Patent: Sep. 15, 2026

(54) MICROWAVE PHOTONIC QUANTUM PROCESSOR

(71) Applicant: MIRAEX SA, Ecublens (CH)

(72) Inventors: Nicolas Schwaller, Chernex (CH); Clément Javerzac-Galy, Vulliens (CH); Olexiy Feofanov, Epalinges (CH)

(73) Assignee: MIRAEX SA, Ecublens (CH)

( * ) Notice: Subject to any disclaimer, the term of this patent is extended or adjusted under 35 U.S.C. 154(b) by 672 days.

(21) Appl. No.: 18/032,314

(22) PCT Filed: Oct. 2, 2021

(86) PCT No.: PCT/IB2021/059068
§ 371 (c)(1),
(2) Date: Apr. 17, 2023

(87) PCT Pub. No.: WO2022/084778
PCT Pub. Date: Apr. 28, 2022

(65) Prior Publication Data

US 2023/0409946 A1 Dec. 21, 2023

(30) Foreign Application Priority Data

Oct. 20, 2020 (EP) .................................... 20202922

(51) Int. Cl.
*G06N 10/40* (2022.01)
*G06N 10/20* (2022.01)
(Continued)

(52) U.S. Cl.
CPC ............. *G06N 10/40* (2022.01); *G06N 10/20* (2022.01); *H10N 60/12* (2023.02); *H10N 69/00* (2023.02)

(58) Field of Classification Search
CPC ........ G06N 10/40; G06N 10/20; H10N 60/12; H10N 69/00
See application file for complete search history.

(56) References Cited

U.S. PATENT DOCUMENTS

2019/0020346 A1* 1/2019 Wang .................. H03K 19/195
2020/0052359 A1 2/2020 Painter
2022/0094341 A1* 3/2022 Pellerano ............... H10N 69/00

FOREIGN PATENT DOCUMENTS

WO 2020/056324 3/2020

OTHER PUBLICATIONS

Xiu Gu, et al., "Microwave photonics with superconducting quantum circuits", available at www.elsevier.com/locate/physrep, Jul. 7, 2017; 102 pages.

(Continued)

*Primary Examiner* — K C Chen

(74) *Attorney, Agent, or Firm* — Faegre Drinker Biddle & Reath LLP

(57) ABSTRACT

A quantum processor is provided according to one embodiment of the present invention. The quantum processor uses propagating microwave photons as flying qubits, encoded in a dual-rail configuration. The dual-rail configuration is characterised by the fact that one photon encodes a qubit, and one photon at most is present in a transmission line. The quantum processor comprises single-qubit gates and two-qubit gates for performing state operations on the qubits. The single-qubit gates comprise directional couplers and phase shifters, while the two-qubit gates comprise electronic circuits including LC oscillators and Josephson junctions. The quantum processor further comprises a single microwave photon generation circuit and a microwave photon detector circuit.

15 Claims, 16 Drawing Sheets

(51) Int. Cl.
*H10N 60/12* (2023.01)
*H10N 69/00* (2023.01)

(56) References Cited

OTHER PUBLICATIONS

Mirhosseini, M. Kim, et al., “Superconducting metamaterials for waveguide quantum electrodynamics”, Nature Communications, vol. 9, No. 1, 2018; 7 pages.
Ollikainen Tuomas, “Two-qubit gates in a microwave photonic quantum computer”, Jul. 1, 2015, available at https://aaltodoc.aalto.fi/bitstream/handle/123456789/17769/master_Ollikainen_Tuomas_2015.pdf?sequence=1&isAllowed=y; 74 pages.
International Search Report and Written Opinion as issued by the International Searching Authority, dated Dec. 22, 2021, for International Patent Application No. PCT/IB2021/059068; 13 pages.

* cited by examiner

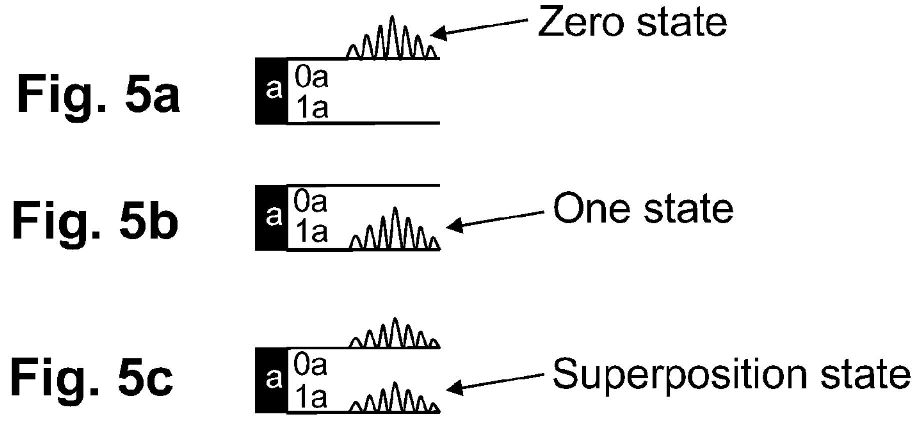
Fig. 5a
Fig. 5b
Fig. 5c
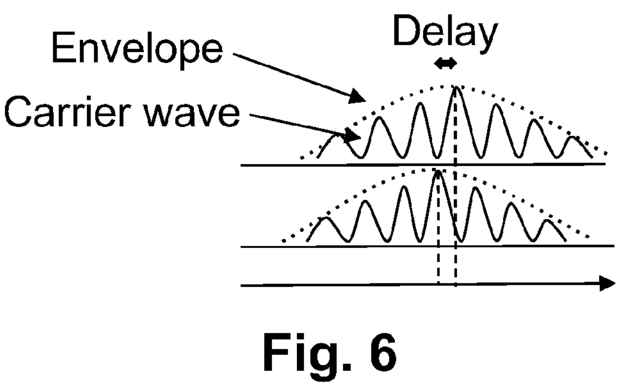
Fig. 6
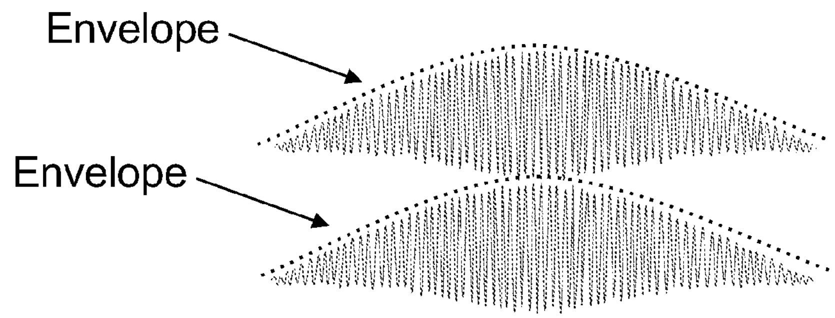
Fig. 7

$$S = \begin{pmatrix} 0 & \alpha & i\beta & 0 \\ \alpha & 0 & 0 & i\beta \\ i\beta & 0 & 0 & \alpha \\ 0 & i\beta & \alpha & 0 \end{pmatrix} \quad \alpha = \sqrt{1-\beta^2} \quad U_{tot} = \begin{pmatrix} \alpha & i\beta e^{i\varphi} \\ i\beta e^{i\lambda} & \alpha e^{i(\varphi+\lambda)} \end{pmatrix}$$

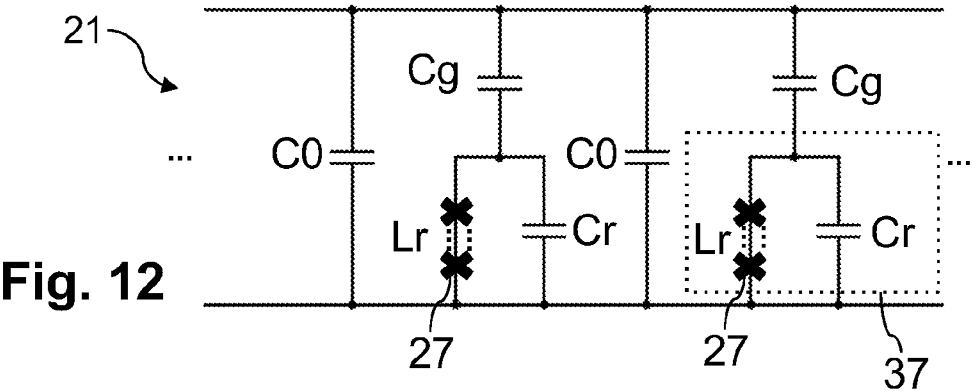
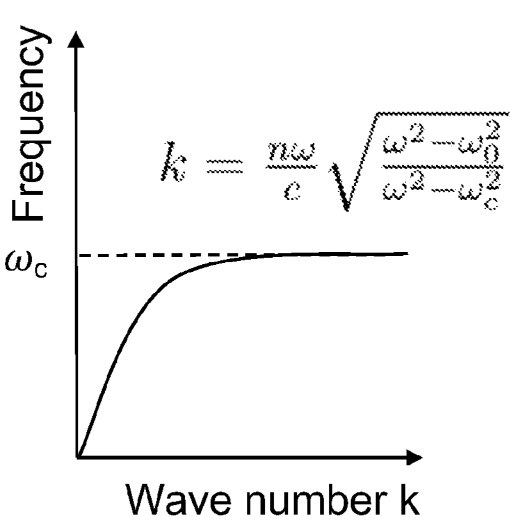
Fig. 13
$$n_g = \frac{n\omega_c\sqrt{\omega_0-\omega_c}}{\sqrt{-4(\omega-\omega_c-i\gamma_i)^3}}$$
$$\omega_c = \omega_0\sqrt{1-\frac{C_g^2}{((C_0+C_g)(C_r+C_g))}}$$

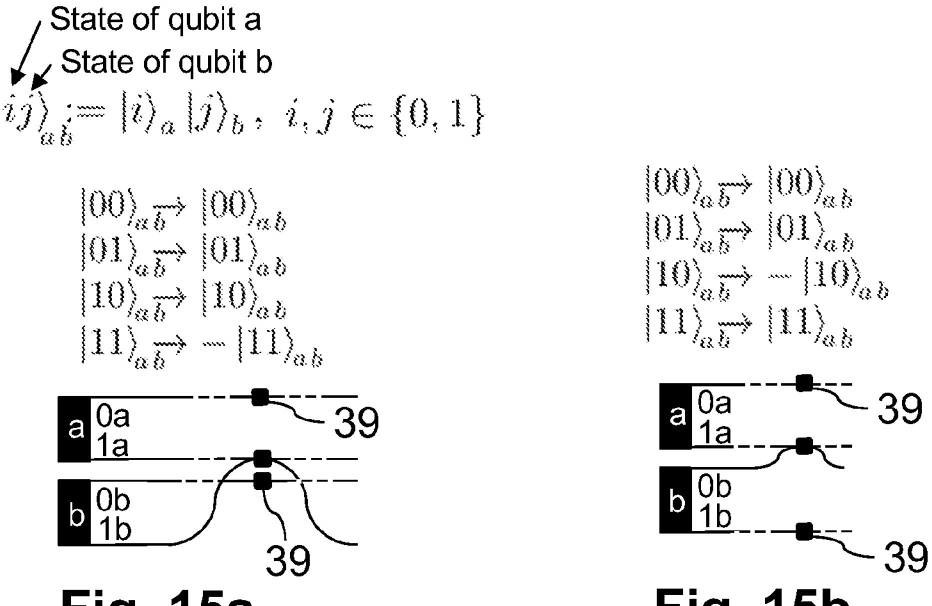
Fig. 15a
Fig. 15b
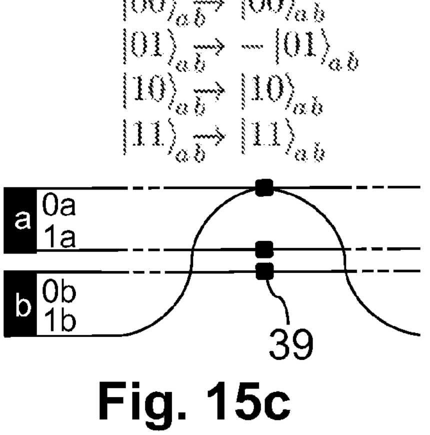
Fig. 15c
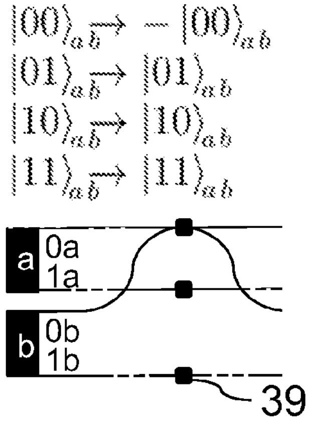
Fig. 15d

MICROWAVE PHOTONIC QUANTUM PROCESSOR

CROSS-REFERENCE TO RELATED APPLICATIONS

The present application is a national stage entry of International (PCT) Patent Application Number PCT/IB2021/059068, filed Oct. 2, 2021, which claims priority to European Patent Application Number 20202922.9, filed Oct. 20, 2020, the complete disclosures of which are expressly incorporated herein by reference.

TECHNICAL FIELD

The present invention relates to a quantum computing circuit configured to process microwave photons. More specifically, there is proposed a quantum computing circuit for microwave photonic flying qubits. The invention also relates to a quantum processor and to a corresponding method of operating the quantum processor.

BACKGROUND OF THE INVENTION

The paradigm of linear optical quantum computing (LOQC) is well established. It uses travelling optical photons (i.e., flying qubits) to encode qubits, and it was developed for optical photons. The operations are performed on the propagating state using optical elements. Different schemes exist for encoding photonic flying qubits, such as a single-rail configuration (time-bin, polarisation, frequency), and a dual-rail configuration (spatial mode). The main difficulty with LOQC is that optical photons do not exhibit strong interaction between each other. Particularly, universal quantum computation would require using controlled gates, which can be implemented by allowing interactions between different photons. Controlled optical photonic gates have been proposed, and they use linear optical elements, requiring post-selection and rather complicated designs. Compared to Josephson junction based superconducting qubits, which operate at microwave frequencies, photonic flying qubits have a huge coherence time. This means that the quantum state can be kept intact for a long time thanks to their weak interaction, while the quantum states of microwave superconducting qubits with Josephson junctions are fragile and have a short lifetime. The limited lifetime of Josephson junction based superconducting qubits is one of the main difficulties which slows down the progress in practical implementations of these solutions.

Currently known superconducting qubit computing solutions use stationary qubits implemented by superconducting circuits with a fixed physical location on the chip. Quantum gates of these solutions are implemented or programmed by time-domain signals, such as pulses sent to the qubit(s) through microwave resonators. Depending on the pulse shape/duration or a sequence of such pulses, a different gate function (for example not, c-not, Hadamard, phase shift, control-z) can be created. This kind of pulse or the sequence of pulses then makes the qubits interact with each other. These kinds of solutions have the limitations that it is hard to scale down the hardware of the qubits because they have lots of crosstalk. Furthermore, each one of the qubits should be slightly different (in a controlled way) from the other qubits it is coupled to, and each pulse channel requires filters and attenuators, which take space.

SUMMARY OF THE INVENTION

It is an object of the present invention to overcome at least some of the problems identified above related to quantum computing.

According to a first aspect of the invention, there is provided a quantum computing circuit as recited in claim 1.

The present invention brings together the advantages of both the microwave and optical domain quantum computing solutions in the proposed quantum computing circuit using microwave photons as flying qubits. The proposed solution benefits from the advantages of the superconducting microwave quantum circuits:

- well-developed fabrication techniques;
- high-fidelity of preparation and controllability of state; and
- possibility to engineer large coupling strength between microwave photons.

At the same time, the solution has the advantageous characteristics of photonic quantum computation:

- long coherence time of a few seconds (which represents approximately $10^5$ times the coherence time of the known microwave qubits) due to the fact that photons interact weakly with the environment, so their state is stable during the propagation; and
- fast computation due to the fact that the photons travel at a high speed and go through fixed gates, which means that the gates can be applied autonomously.

It is thus proposed to bring the linear optical quantum computing paradigm to the microwave range, using microwave photons instead of optical ones. Thanks to the low energy of microwave photons, the microwave domain operation can be combined with the advanced technologies of superconducting quantum computers, which are used in the present invention to build quantum gates to manipulate the states of the flying qubits.

Furthermore, contrary to the existing solutions, the proposed solution encodes the quantum information in the states of microwave photons travelling on a chip, which we are in the present description referred to as flying qubits. Thus, the proposed solution does not have hardware qubits, but instead, advantage is taken from travelling qubits that pass through the gate operations with the corresponding evolution of their states. According to the proposed solution, gates are implemented by components with a fixed physical location in the microwave circuit.

According to a second aspect of the invention, there is provided a quantum processor comprising the quantum computing circuit according to the first aspect of the present invention, and further comprising a set of single microwave photon generators and a set of single microwave photon detectors as recited in claim 14.

According to a third aspect of the invention, there is provided a method of operating the quantum processor as recited in claim 15.

Other aspects of the invention are recited in the dependent claims attached hereto.

BRIEF DESCRIPTION OF THE DRAWINGS

Other features and advantages of the invention will become apparent from the following description of a non-limiting example embodiment, with reference to the appended drawings, in which:

FIGS. 5*a* to 5*c* illustrate the principle of storing quantum information in a flying qubit;

FIG. 6 illustrates the principle of introducing a phase shift between carrier waves of two microwave photons;

FIG. 7 shows the phase-shifted carrier waves of FIG. 6, and it further shows how the delay felt by the signal envelopes is negligible;

FIG. 12 shows a structure of a metamaterial transmission line that may be used in the quantum gates of the present invention;

FIG. 13 shows the frequency curve in the metamaterial as a function of wave number k;

FIGS. 15*a* to 15*d* schematically illustrate different two-qubit gate configurations according to the present invention;

DETAILED DESCRIPTION OF AN EMBODIMENT OF THE INVENTION

Figure 1:
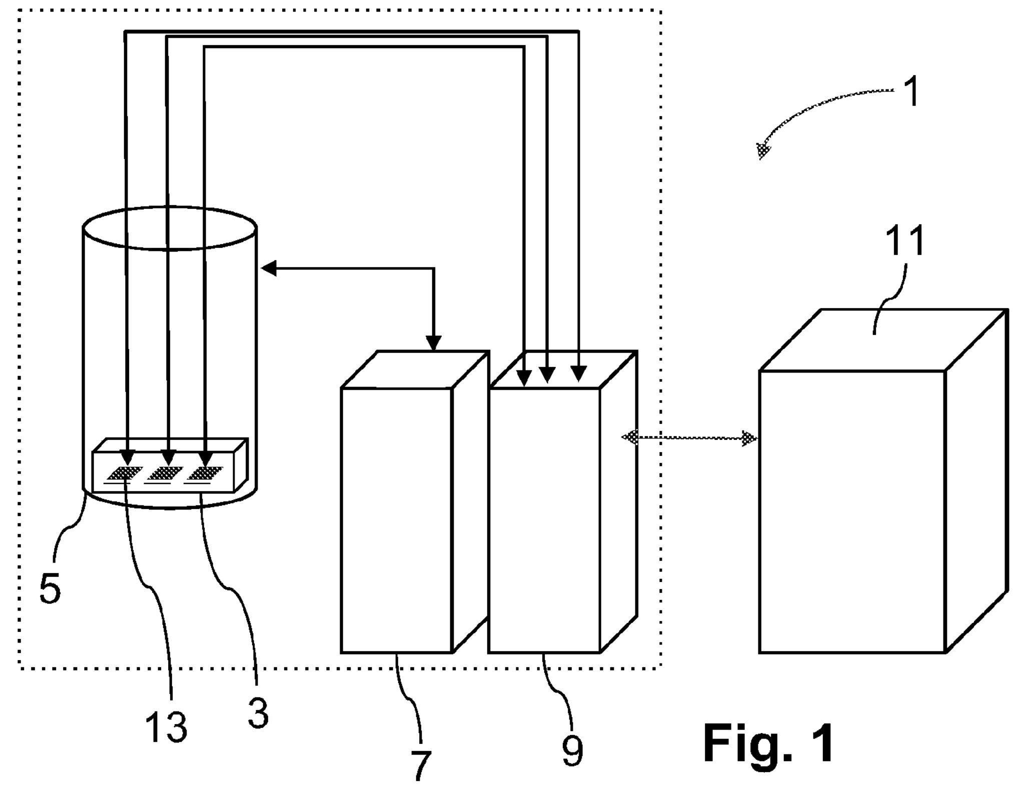
FIG. 1 schematically illustrates the environment where the teachings of the present invention may be applied.

An embodiment of the present invention will now be described in detail with reference to the attached figures. Identical or corresponding functional and structural elements which appear in the different drawings are assigned the same reference numerals. When the words first and second are used to refer to different elements, it is to be understood that this does not necessarily imply or mean that the first and second elements are somehow structurally substantially different elements or that their dimensions are substantially different unless this is implicitly or explicitly made clear in the context. A qubit is understood as the unit of quantum information. It has a physical implementation which enables the storage and the manipulation of quantum information. A quantum gate is the operation on or manipulation of that qubit or a microwave photon encoding the qubit, or a circuit element capable of carrying out that manipulation.

The optical region of the electromagnetic (EM) spectrum refers approximately to the region with wavelengths between 100 nm (3 PHz frequency) and 1 mm (300 GHz) comprising the ultraviolet, visible, and infrared regions. Of particular interest is the near-infrared band used for fibre optic telecommunication, extending approximately from 1260 to 1675 nm, as well as the visible band, extending approximately from 390 to 780 nm. The microwave region of the EM spectrum refers approximately to the region with wavelengths between 1 mm (300 GHz) and 1 m (300 MHz).

FIG. 1 schematically illustrates a processing system 1, which is a combined central processing unit-quantum processing unit system 1, where the teachings of the present invention may be applied. As is shown in FIG. 1, a quantum processing unit 3, also simply referred to as a quantum processor or computer, is placed inside a refrigerator 5, which in this case is a dilution refrigerator. A dilution refrigerator controller 7 is provided to control the operation of the refrigerator 5, while a gate controller 9 is provided to optionally control the operation of the gates inside the quantum processor. A central processing unit 11 is arranged to control the operation of at least some of the above elements, and to store the results of the operations carried out by the quantum processor. The central processing unit is in this example also configured to interpret the quantum instructions given in a quantum assembly programming language (QASM) and convert them to the microcode of the particular quantum processor. A microwave circuit 13 is also shown inside the dilution refrigerator to generate microwave photons that can be input into a quantum computing circuit 15 of the quantum processor 3.

Figure 2:
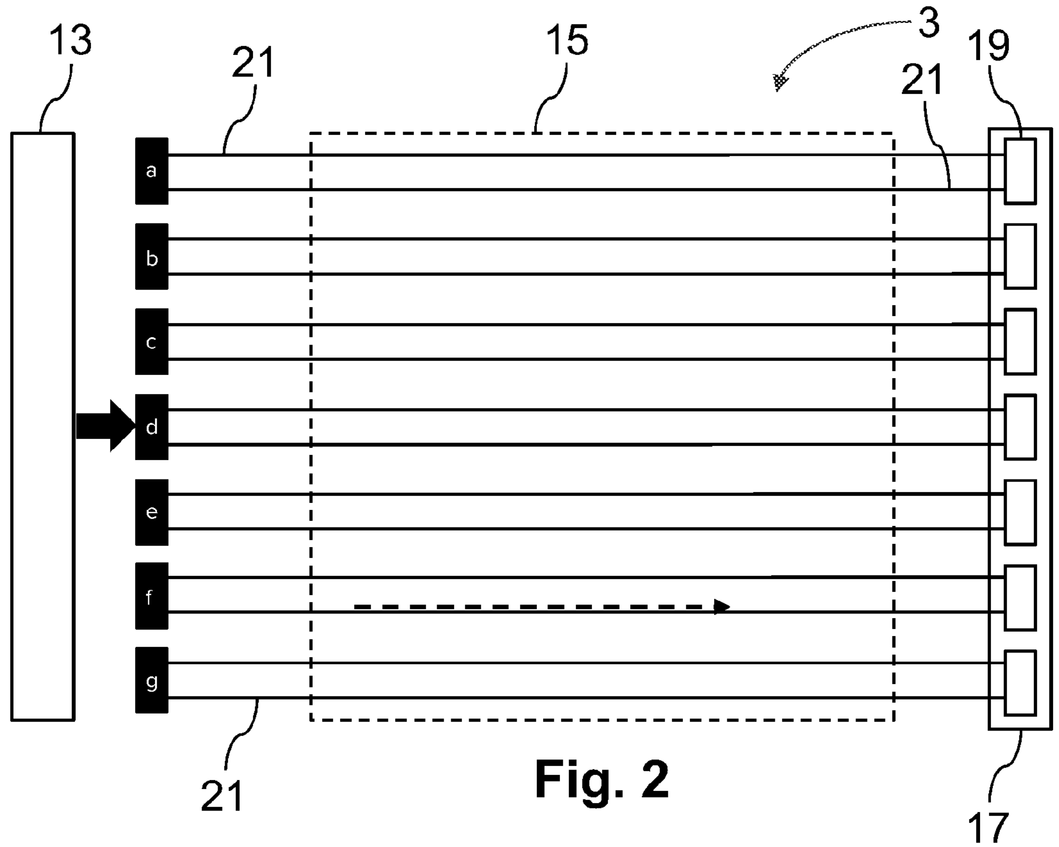
FIG. 2 schematically illustrates the quantum processor according to an embodiment of the present invention.

FIG. 2 schematically illustrates the quantum processor 3 of the present embodiment. In this example, the quantum processor comprises the microwave circuit 13, which is configured as a microwave photon generation circuit or simply a microwave photon generator. The quantum processor also comprises a quantum computing circuit or framework 15, where the quantum computing or processing is implemented as explained later in more detail. The quantum computations are implemented by a first set of first quantum gates, which are single-qubit gates, and a second set of second quantum gates, which are two-qubit gates, as explained later in more detail. At the output of the quantum computing circuit 15, the quantum processor comprises a measurement or detection circuit 17, which in this example comprises a set of single microwave photon detectors 19. It is to be noted that in this present example, the quantum processor is defined to comprise the microwave photon generation circuit 13, the quantum computing circuit 15, and the measurement circuit 17. However, the quantum processor 3 could instead be defined so that it merely comprises the quantum computing circuit 15, and optionally the microwave photon generation circuit 13, or the measurement circuit 17. The dashed arrow in FIG. 2 indicates the direction of propagation of the travelling (flying) microwave photons within or along transmission lines 21, which in this example are superconducting transmission lines, and which may also be understood to be part of the quantum computing circuit 15.

Figure 3:
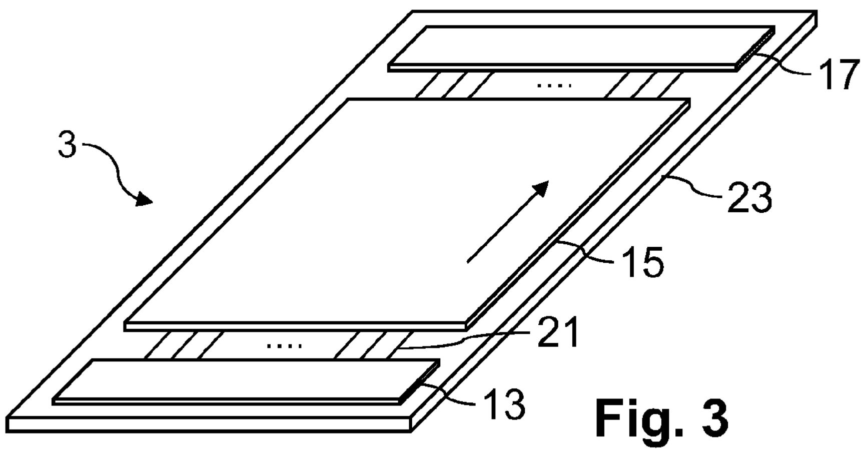
FIG. 3 is another schematic view of the quantum processor of FIG. 2.

FIG. 3 shows the quantum processor 3 placed on a dielectric substrate 23, which during operation is located in a cryogenic environment (i.e. in the refrigerator 5). Conventional cryogenic microwave technologies work at frequencies around 6 GHz and require temperatures of a few tens of mK. In principle, the proposed architecture can be scaled to operate at higher frequencies, allowing higher temperature operation (above 1K) which would need less heavy cryogenic equipment. Such an improvement depends on the adapted superconducting technologies, especially Josephson junctions.

Figure 4:
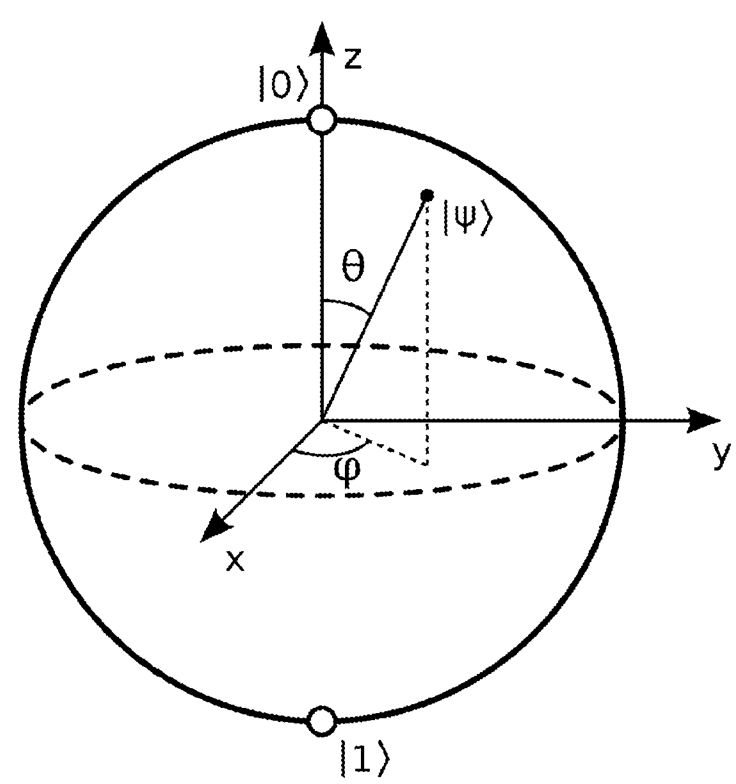
FIG. 4 is a geometrical representation of the pure state space of a two-level quantum mechanical system, i.e. a quantum bit or qubit for short.

Before explaining the teachings of the present invention in more detail, a definition is first given for a quantum bit. Just like classical bits, a quantum bit, also referred to as a qubit, can be in the state 0 and 1. Moreover, it can be in any superposition state of 0 and 1 (θ), and in addition, its state has a coordinate called "phase" (φ) which is specified by an angle up to 360°. Thus, the state of a quantum bit is conveniently represented as a point on the surface of a sphere. This is called the Bloch sphere representation of the state of a flying qubit, as illustrated in FIG. 4.

Two ingredients are needed for quantum computation:

1. The ability to change the state of a flying qubit, i.e. the coordinate on the sphere. This can be performed with the proposed one-qubit gate.
2. The ability to implement controlled operations, which act on the state of a flying qubit depending on the state of another qubit. This task is carried out with the proposed two-qubit gate, which may also be called a phase-controlled gate.

An arbitrary single-qubit rotation, together with a controlled phase gate, form a universal set of quantum gates.

According to the present invention, the microwave photonic qubits are encoded in a dual-rail scheme or structure: a flying qubit can be implemented using two rails (transmission lines) in which one microwave photon can propagate. More specifically, a qubit is encoded in the spatial position of the photon in the dual-rail structure. The dual-rail structure comprises a first transmission line (first rail), in the drawings shown as an upper transmission line, and a second transmission line (second rail), in the drawings shown as a lower transmission line. Thus, a dual-rail transmission line element comprises the first and second transmission lines, and the quantum computing circuit 15 in this example comprises a plurality of dual-transmission-line elements. In other words, the quantum processor 3 comprises a plurality of the dual-rail structures. According to the present embodiment, the microwave photon generation circuit 13 is configured to substantially simultaneously feed microwave photons from the single microwave photon generation circuit into the quantum computing circuit 15 such that at most one microwave photon is fed per one dual-rail transmission element. If the microwave photon is travelling in the first rail, the flying qubit is in the state 0, whereas its state is 1 if the microwave photon is located in the second rail, or vice versa. Physically, one microwave photon is constituted of a wave packet of a few meters in length, made of multiple frequencies. Changing the qubit state from 0 to 1, or vice versa, is done simply by transferring the microwave photon from one line to the other. Superposition between 0 and 1 states requires only a part of the microwave photon to be transferred, which results in a spatial quantum superposition of the microwave photon. These different scenarios are illustrated in FIGS. 5*a* to 5*c* for the first flying qubit "a". Last, the phase coordinate of the state of the flying qubit is changed by adding a delay between the two lines, aiming to produce a phase difference in the carrier wave of the two microwave photons as shown in FIG. 6. In the example of FIG. 6, the upper line's photon's carrier wave is delayed by a time $t_1-t_0$ with respect to the bottom one. In reality, as the carrier wavelength is much smaller than the length of the wave packet, the delay felt by the envelope is negligible with respect to the delay felt by the carrier wave. The phase-shifted photon would still overlap with the others. In other words, they are synchronised. This is illustrated in FIG. 7. It is to be noted that the phase of the flying qubit can be understood to be a function of the distance between the maximums (peaks) of the wave constituting a microwave photon. It is measurable between two microwave photons, but it has no meaning for a single microwave photon without an external reference. This corresponds to a rotation around the z axis of the Bloch sphere, i.e. a variation in the phase coordinate φ.

The quantum processor 3 according to the present embodiment preferably requires the simultaneous generation of microwave photons (one photon per flying qubit). More specifically, in the present embodiment, the scheme is based on artificial atoms (e.g. a transmon qubit or a flux qubit), which are excited (energy level), and which thus emit photons, thereby losing their quantum of energy. The time-controlled generation of single microwave photons using artificial atoms is next explained in more detail with reference to FIG. 8. To begin the computation, microwave photons (one per flying qubit) preferably need to be launched simultaneously in the transmission lines 21. For this, a superconducting quantum interference device (SQUID) based artificial atom 25 is used. Its coupling to the respective transmission line 21 can be controlled with an accuracy of about 10 ns. Thus, the atoms are stimulated, and microwave photons are emitted by simultaneously coupling the atoms to the transmission lines 21, which are the input of the quantum computing circuit 15. Cc and Ce are two capacitors characterised by their respective capacitances which are used for coupling the artificial atoms 25 to the transmission lines 21. The arrangement of FIG. 8 can prepare flying qubits in state 1, or state 0 with the exact same physical process. Thus, one can choose the ideal initial state depending on the computation.

The artificial atoms 25 comprise a set of Josephson junctions 27, which are devices that consist of two or more superconductors 29 (in a series configuration) coupled via a weak link 31 that can be a thin layer of insulator, or a non-superconducting metal, or a construction that weakens the superconductivity at the point of contact. The Josephson junctions have very high nonlinearity and low energy dissipation. They are important components of superconducting quantum circuits. The SQUID is made of a loop of two Josephson junctions. It allows the time of the release of the photons to be controlled by applying an external magnetic flux.

Figure 8:
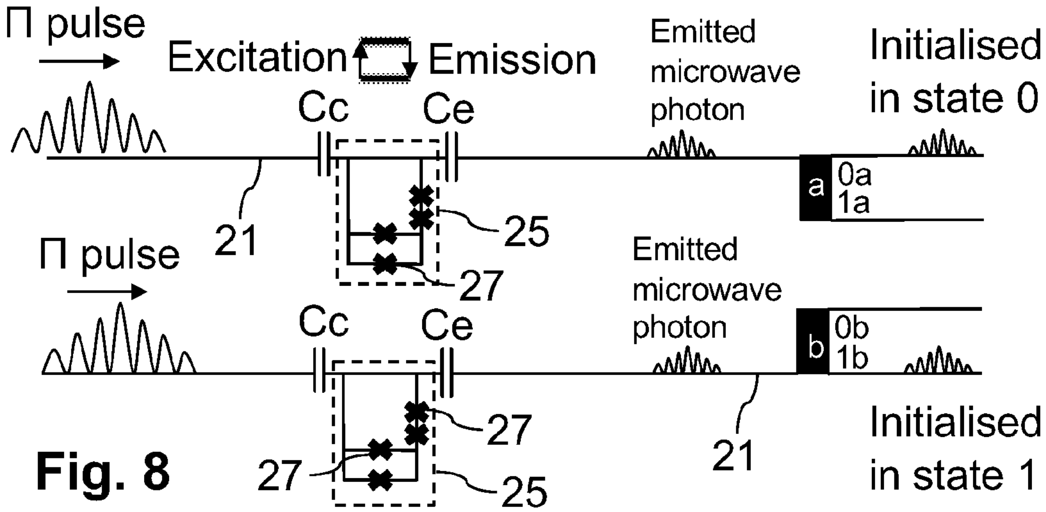
FIG. 8 schematically illustrates a circuit for generating single microwave photons.
Figure 9:
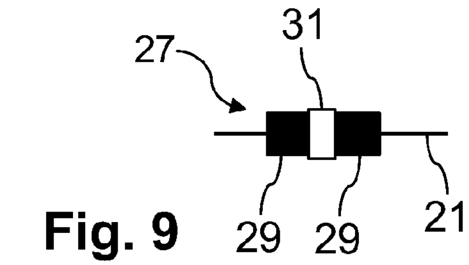
FIG. 9 illustrates the structure of a Josephson junction used for instance in the circuit of FIG. 8.

A microwave pulse designed to excite a two-level system (artificial atom) is in FIG. 8 referred to as a Π pulse, as it corresponds to a π rotation (180°-degree rotation) on the Bloch sphere (from the ground state, i.e. state 0, to the excited state, i.e. state 1). The typical length of a Π pulse is below 10 ns, which is similar to the time scale corresponding to the control of the coupling of the two-level artificial atom. Its frequency is near the resonant frequency of the atom (frequency needed to excite the atom), and its length can be adjusted to maximise the probability of exciting the atom. In principle, any kind of artificial atom can be used to generate the required single microwave photons. The atom-like structure is however advantageous, as it is the exclusive and genuine way to generate single photon states. One single excitation pulse, such as a laser pulse, may be split into several pulses to collectively excite a plurality of artificial atoms.

Figure 10A:
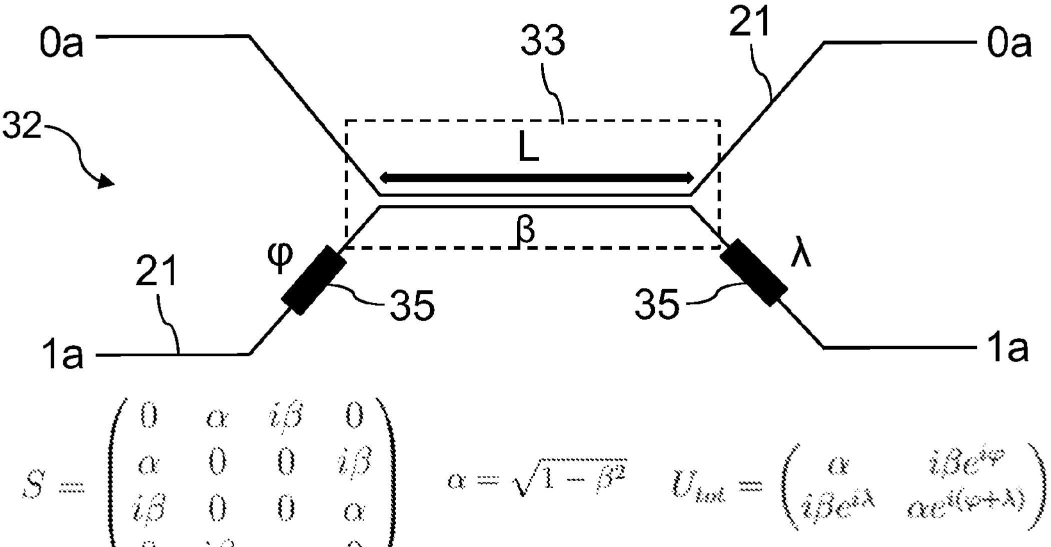
FIGS. 10*a* to 10*g* schematically show different single-qubit gates that may be used in the quantum processor according to the present invention.
Figure 10B:
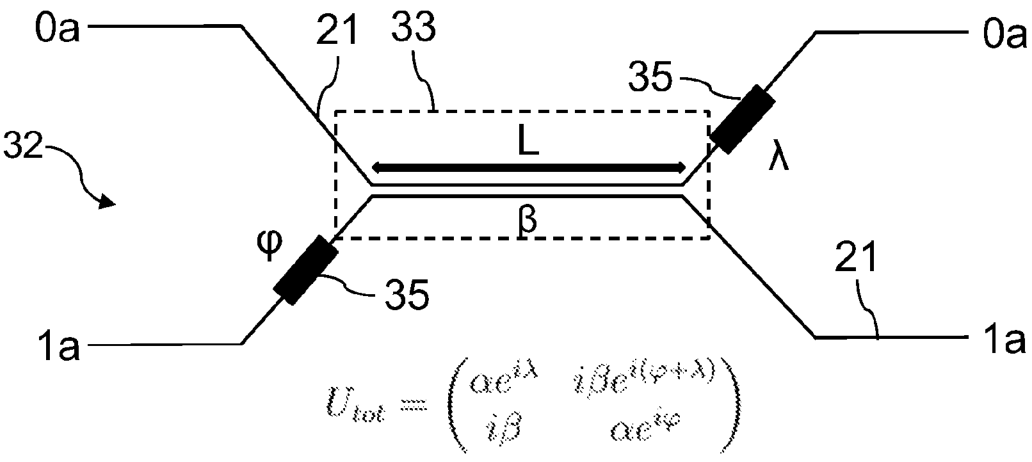
Figure 10C:
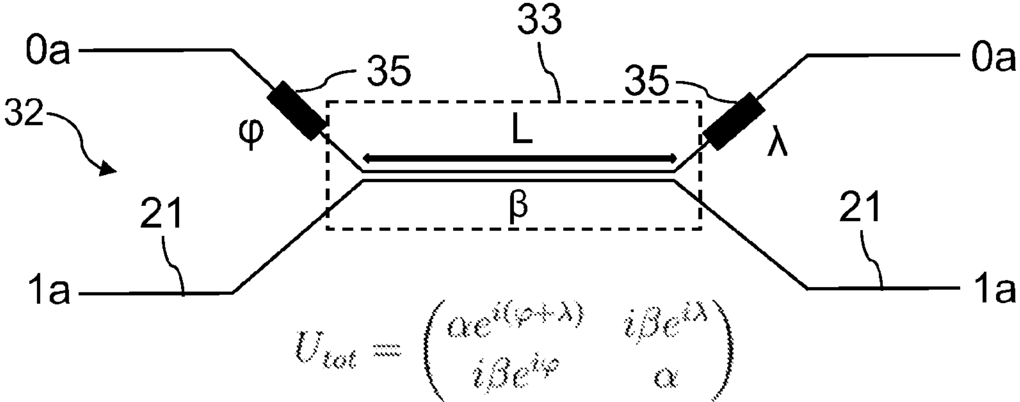
Figure 10D:
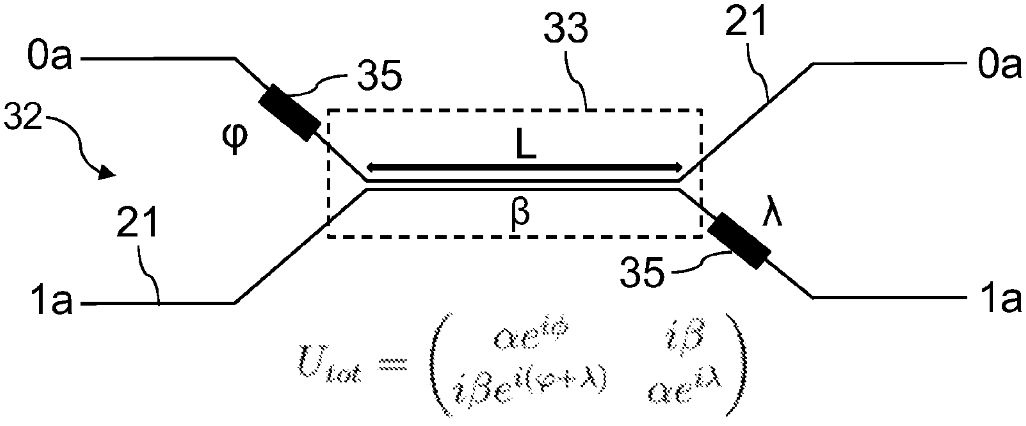
Figure 10E:
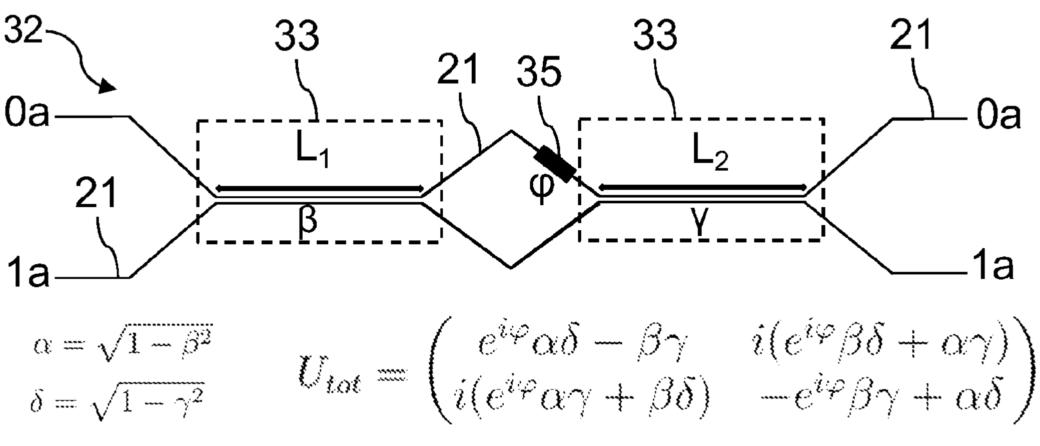
Figure 10F:
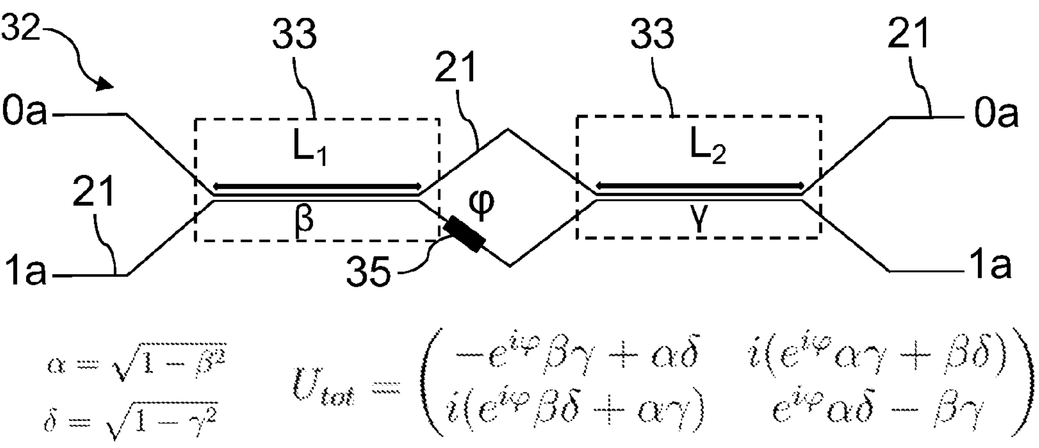

FIGS. 10*a* to 10*g* schematically show different configurations of single-qubit gates 32 that may be used in the quantum computing circuit 15. To achieve any operation on the state of a single flying qubit, it is thus needed to (1) control the amount of wave packet transfer between the first and second transmission lines, and (2) introduce a controllable delay between two photons propagating in the transmission lines. This can be implemented by respectively using directional couplers 33 and phase shifters 35. As shown in FIGS. 10*a* to 10*d*, in these examples, the directional coupler 33 is placed between a first phase shifter and a second phase shifter. A similar function can be achieved by placing a phase shifter in between a first directional coupler and a second directional coupler, as schematically shown in FIGS. 10*e* and 10*f*. However, it is to be noted that one or more of the above elements in FIGS. 10*a* to 10*f* may be omitted without deviating from the teachings of the present invention. Furthermore, any sequence of single-qubit gates schematically shown in FIGS. 10*a* to 10*f* with all the elements present or one or more elements omitted forms a single-qubit gate. A directional coupler consists of two transmission lines which are close enough to each other for the evanescent field of the photon propagating in one line to be present in the other, resulting in a periodic transfer of the energy between the two lines, which depends on the length L of the coupling region. By setting the length L, one can change the coupling constant β of the directional coupler 33, where β=1 means full energy transfer between the lines.

Taking the simplest case of a symmetric coupler with a scattering matrix S as given in FIG. 10*a*, the structure depicted above acts on the flying qubit with the unitary operator $U_{tot}$ as given in FIG. 10*a*. This makes it easy to implement any operation on the flying qubit, in particular $\beta=0$, $\theta=\varphi+\lambda$ for a phase gate $e^{i\theta/2}Rz(\theta)$, $\beta=\sin(\theta/2)$, $\varphi=\pi/2$, $\lambda=3\pi/2$ for $Ry(\theta)$, and $\beta=\sin(\theta/2)$, $\varphi=\lambda=\pi$ for $Rx(\theta)$. For example, Hadamard gate is constructed as $H=Ry(\varphi/2)$.

The configuration of FIG. 10*a* to position the phase shifters in the circuit implementing the single-qubit gate is not the only option. For example, it is possible to place the λ phase shifter 35 on the 0 line, which yields a new unitary matrix as given in FIG. 10*b*. With this matrix, it is possible to implement the gates $iRy(\theta)$ with $\varphi=\lambda=\pi/2$, $\beta=\sin(\theta/2)$, $e^{i\varphi/2}Rz(\varphi)$ with $\lambda=0$, $\beta=0$, and $iX$ with $\varphi=\lambda=0$, $\beta=1$. Depending on the gate to be implemented and on the input state, different physical positions of the phase shifters in the single-qubit gate can be advantageous, resulting in a reduced useless group delay between the microwave photons, and saving space. FIGS. 10*c* and 10*d* show further configurations of the first and second phase shifters. In the configuration of FIG. 10*c*, both phase shifters 35 are on the 0 line, while in the configuration of FIG. 10*d*, the φ phase shifter (i.e., the phase shifter that introduces the phase shift equal to φ) is on the 0 line, and the λ phase shifter (i.e., the phase shifter that introduces the phase shift equal to λ) is on the 1 line. FIGS. 10*e* and 10*f* show possible implementations of the single-qubit gates using a β directional coupler 33 (i.e., the directional coupler with the coupling constant equal to β) and a γ directional coupler 33 (i.e., the directional coupler with the coupling constant equal to γ) with a φ phase shifter 35 between the directional couplers. In the configuration of FIG. 10*e*, the phase shifter is on the 0 line, while in the configuration of FIG. 10*f*, the phase shifter is on the 1 line.

Figure 10G:
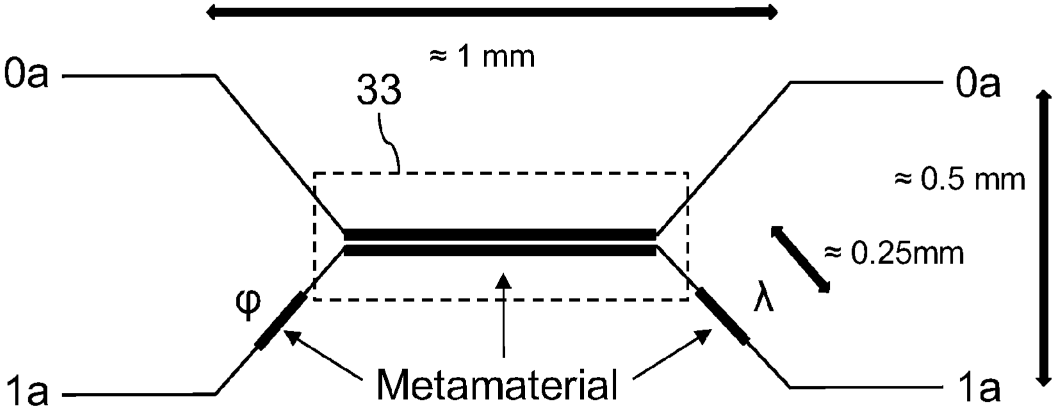

Any of the single-qubit gates of the configurations of FIGS. 10*a* to 10*f* may be modified by using metamaterial to build the directional couplers 33, and/or phase shifters 35, in order to reduce their size consequently. This variant is schematically illustrated in FIG. 10*g*. It is to be noted that one or more of the elements of the gate could be made of the metamaterial. Alternatively, the directional couplers could be made of conventional superconducting transmission lines, and the phase shifters could be implemented with other types of delay lines, such as conventional lines having a longer path of controlled length. As interaction between microwave photons happens on a length scale comparable to the wavelength of the respective microwave photon, the use of a slow-light metamaterial, which shrinks the effective wavelength, allows the length of the directional coupler to be reduced from a few centimetres to about 1 mm. Thus, the length L, $L_1$, $L_2$ of the directional coupler is in the present example less than 5 mm, and in particular less than 2 mm. The metamaterial can also, or in addition, be used to implement small-size phase shifters, under the form of metamaterial delay lines. Thus, the size of the directional couplers and/or the phase shifters, and in this manner the size of the single-qubit gate, can be optimised thanks to the use of metamaterial. It is to be noted that any dimensions, given for instance in the drawings, are merely some example values, but are by no means intended to be limiting.

Metamaterials are structured, periodic arrays of elements, with a lattice constant much smaller than a given wavelength. They can grant optical properties which are not present in nature, such as very high or negative refractive index. The concept of metamaterial was first developed in microwave engineering, with a wavelength of a few centimetres in length. Photonic crystals (metamaterials) also exist for the optical range, but it is more difficult to fabricate them for the optical domain as wavelengths in optics are much smaller. In the present context, i.e. microwave photons propagating through cryogenic transmission lines, metamaterials can be made of lumped elements (electronic circuits) coupled to the transmission line, benefiting from the advanced fabrication techniques in this domain, for example according to Mirhosseini, M., Kim, E., Ferreira, V. S., Kalaee, M., Sipahigil, A., Keller, A. J., & Painter, O. (2018), "Superconducting metamaterials for waveguide quantum electrodynamics", Nature Communications, 9(1). The role of the metamaterial here is to allow an interaction between microwave photons over small distances. As the interaction needs to happen over a length of the order of the wavelength (which is typically a few centimetres for microwaves), it is advantageous to use a metamaterial which has a large effective refractive index, thus reducing the wavelength of the photons, allowing operations on the state of the flying qubit with gates having a length of approximately 1 mm. This results in a quantum chip with a length of a few centimetres. Thus, the use of metamaterials is not mandatory in the present invention, but they would allow the quantum processor to be made smaller, and thus it would be possible to use a small refrigerator 5.

Figure 11:
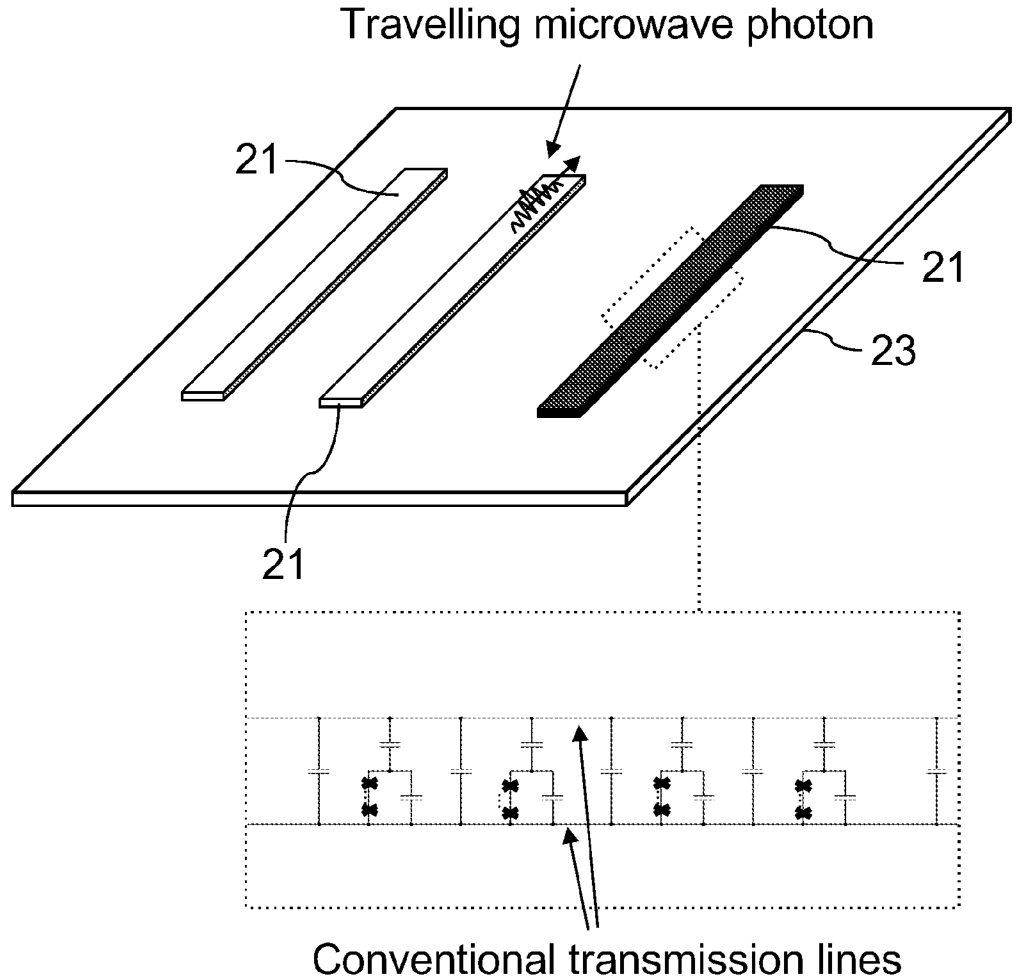
FIG. 11 shows transmission lines that may be used in the quantum processor according to the present invention.

FIG. 11 shows an example configuration, where two conventional transmission lines 21 of superconducting material (white lines) and one metamaterial transmission line 21 (black line) are placed on a dielectric substrate 23. Conventional transmission lines are used to carry the microwave photons encoding the flying qubits. A commonly used microwave transmission-line type is the microstrip transmission line, which is constituted of a thin ribbon of electrically conducting material placed above an electrically conducting flat surface (usually referred to as the ground plane) with a dielectric layer separating them. Another commonly used type of the microwave transmission lines is the coplanar waveguide, which is constituted of two or three ribbons of electrically conducting material placed on top of a dielectric flat surface; the coplanar waveguides may sometimes feature an additional ground plane on the other side of the dielectric material. Due to the flat shape of the transmission lines, the polarisation of the propagating photons is fixed, and only one polarisation is supported. In some specific embodiments, with non-planar transmission lines, polarisation can be used to encode quantum information. In that case, the rotation of the polarisation angle replaces the function taken previously by the microwave phase shift as the relevant quantum state parameter. In the present embodiment, transmission lines are exclusively used to transport the qubits in the quantum processor 3. They are made of superconducting material placed on the dielectric substrate 23. On the other hand, in practice, metamaterial transmission lines (made with an arrangement of electronic components) can also be used as transmission lines, with the only difference that their effective refractive index (or permittivity) is very high, thus photons propagate slower, and their wavelength is reduced while travelling in metamaterial transmission lines. Thus, in the present context the purpose of metamaterial transmission lines is to convey photons with a high effective refractive index.

FIG. 12 illustrates a possible implementation of the metamaterial transmission-line structure in more detail. The metamaterial transmission line is constituted of a coplanar waveguide where the signal line and a return conductor (in FIG. 12 the horizontal lines) are periodically shunted by resonators 37 comprising capacitors Cr and chains of Josephson junctions 27. In a respective resonator 37, the capacitor Cr is arranged parallel to the set of Josephson junctions 27. This type of metamaterial transmission line can be used as phase shifters and/or in the directional coupler to reduce the effective wavelength of the microwave photons and thus the size of the elements. The chains of Josephson junctions can also be replaced by another compact high-impedance inductor (superinductor), which could be made of, e.g., a conventional inductor, a nanowire, a strip of granular or amorphous superconductor, with a given inductance. Capacitors C0, Cg, Cr provide the capacitance between the bottom and top transmission lines, the coupling capacitance between the resonator 37 and the top transmission line, and the capacitance of the resonator 37, respectively. Lr is the inductor, or more specifically the inductance of a chain of Josephson junctions in series or a superinductor, if it is used instead.

The metamaterial has a bandgap where no light or photons can propagate. Near this band gap, the frequency as a function of the wave vector (referred to as a wave number in FIG. 13) has a vanishing slope, equivalent to a group velocity of zero. Approaching this region enables slow microwave photons, i.e. with high effective electric permittivity/refractive index. The wavelength $\lambda$ is reduced by the group index $n_g$, and we have $\lambda_{eff}=\lambda/n_g$. Thus, the lengths of the directional coupler and the phase shifters are reduced by the same amount. The following notations are used in FIG. 13: $\omega_c$: cut frequency (bottom of the band gap); $\omega$: angular frequency of the microwave photon; n: refractive index of the medium; c: speed of light in vacuum; k: wave number; $\gamma_i$: intrinsic losses (decay rate) in a resonator; and $\omega_0$: resonance frequency. For $\omega$ close to $\omega_c$, the group index $n_g$ can be approximated as outlined in FIG. 13.

Figure 14A:
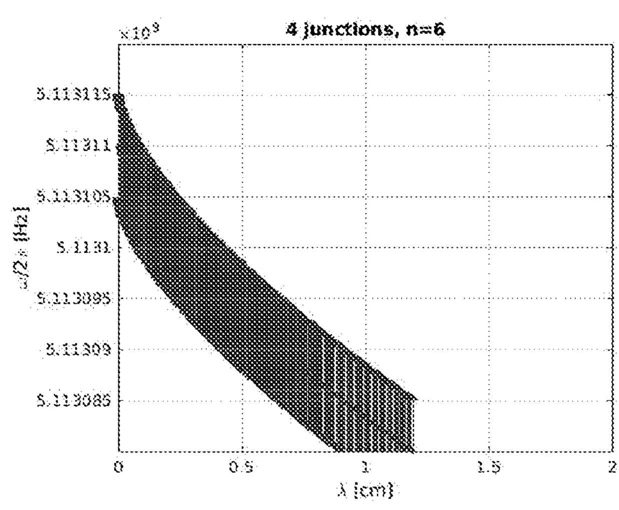
FIGS. 14*a* to 14*c* show how effective wavelength depends on the frequency in the metamaterial transmission line of FIG. 12.
Figure 14B:
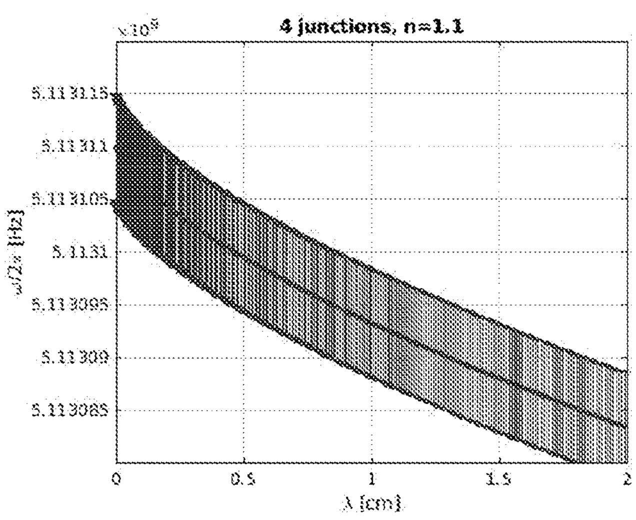
Figure 14C:
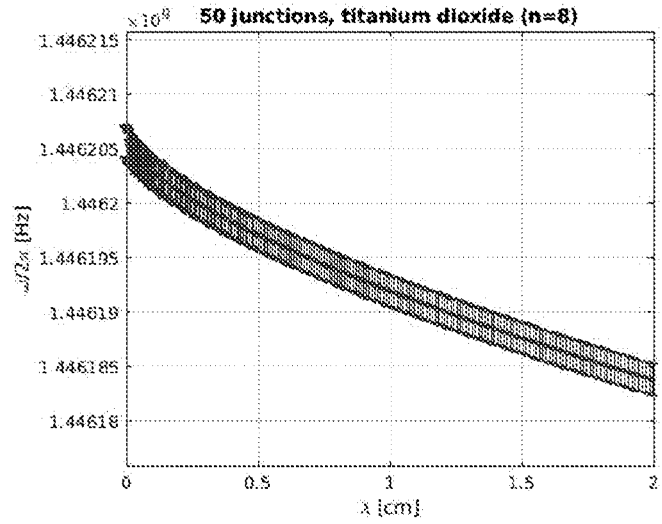

The smallest obtainable effective wavelength in the metamaterial highly depends on the quality factor Q of the oscillators, on the refractive index of the substrate, on the number of Josephson junctions in the chains (the inductance value Lr), and on the other parameters of the circuit. Taking Q=1,000,000, the effective wavelength vs frequency relation can be computed as shown in FIGS. 14*a* to 14*c*. The computation was carried out with 0.33 nH Josephson junctions, and error bars have a width of $\omega/10^6\ s^{-1}$. The cut frequency $\omega_c$ drops as the number of junctions increases, and it can be seen that an operating frequency of $\omega/2\pi$ near 6 GHz corresponds to a number of junctions which is approximately 10. A wavelength of $\lambda$=0.4 cm would require a coupling length of up to $\lambda/4$=1 mm for the directional couplers and coming to the phase shifters, a phase shift of $\pi=n_g\omega L/c$ would be produced by a metamaterial length of L=0.25 mm, assuming $\omega/2\pi$=6 GHz and $n_g$=100. The following parameter values were used for calculations: L0=0.7885 nH, C0=50.5 fF, Cg=389 fF, Cr=345 fF, Ljj=0.33 nH (1 Josephson junction).

FIGS. 15*a* to 15*d* illustrate different configurations for controlled gates or two-qubit gates that may be used in the quantum computing circuit 15. The basic controlled operation we aim to build is a controlled phase gate. This means that depending on the state of the controlling flying qubit, a phase operation is performed on the state of the controlled or target flying qubit. Thanks to the dual-rail architecture, we can selectively make two flying qubits interact only when they are in the desired states, for example, both are in the excited state (FIG. 15*a*). For example, we can connect the corresponding rails of the controlling and the target flying qubits to a non-linear transmission line. When two photons travel simultaneously or sufficiently simultaneously through the non-linear transmission line, in which inductance and/or capacitance depend on the number of photon excitations, they will accumulate different amount of phase than if there is only one excitation as the propagation velocity is inversely proportional to the square root of the product of the inductance per the unit of length and the capacitance per the unit of length. A practical example of such a transmission line can be the transmission line with one or more appropriately designed Josephson junctions. In this case the controlled phase gate can be implemented by using the defined length of the transmission line. Alternatively, the corresponding rails of the controlling and the target flying qubits can be connected to two different non-linear transmission lines placed in the near-field of each other. This will also modify the photon propagation velocity, but to a smaller extent than in the case of the single non-linear transmission line.

Another approach to implement the two-qubit gate is to exploit the vacuum Rabi oscillations effect as explained later in more detail when coupling together two lines belonging to different flying qubits. This effect, which occurs only when two microwave photons (the one from each flying qubit) are present, causes a delay of these microwave photons, that is equivalent to a dephasing of the corresponding state of the two qubits (with respect to the other photons propagating in the quantum computing circuit). In the configurations of FIGS. 15*a* and 15*b*, state 1 is used as the control state, while in the configurations of FIGS. 15*c* and 15*d*, state 0 is used as the control state. For example, in the configuration of FIG. 15*a*, the controlling qubit is qubit a, while the controlled qubit is qubit b, although this notation could be reversed. The minus sign in the drawings means that the respective input photons (and thus the qubits) are phase-shifted with respect to the other photons in the quantum computing circuit 15. Both of the photons entering the two-qubit gate are thus delayed by the same or substantially same amount. Thus, in the configuration of FIG. 15*a*, qubits a and b are delayed with respect to the other qubits when both the qubit states are 1. The notable advantage of the controlled gate of FIG. 15*b* is the ability to avoid any crossing between the transmission lines. Indeed, this particular option constitutes probably the best controlled operation, sufficient with the combination of one-qubit operations, to reach universal quantum computations. However, its fabrication process may not be as easy as the fabrication process of the controlled gates of FIGS. 15*a*, 15*c*, and 15*d*. The dashed portions of the transmission lines indicate delay sections to compensate for the delay introduced by the curved portions of the transmission lines 21. Furthermore, the black square boxes are oscillator circuits or systems 39, and more specifically Rabi oscillators, as explained next in more detail. The Rabi oscillators 39 are configured to introduce a conditional phase shift with "vacuum Rabi oscillation" between the respective qubits.

Figure 16:
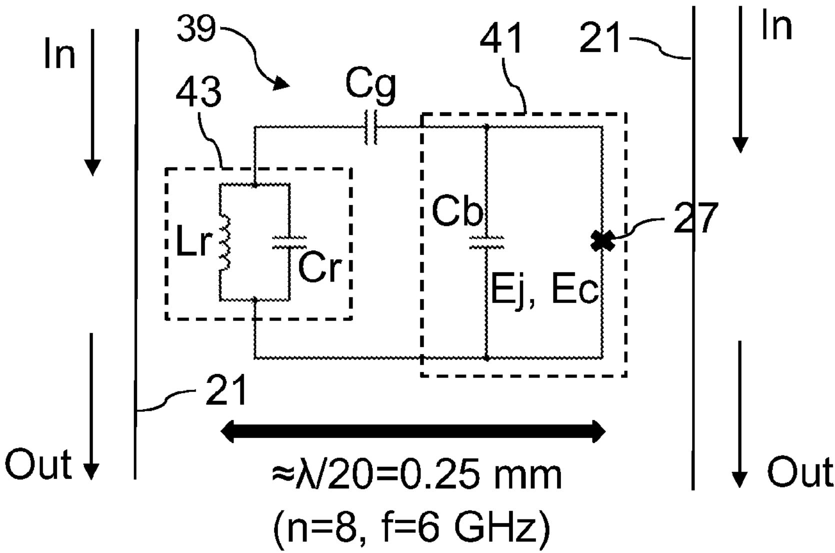
FIG. 16 is a circuit diagram representation of a two-qubit gate according to the present invention.

Vacuum Rabi oscillation is a spontaneous phenomenon which occurs in a quantum system when a photon is periodically transferred between the level of an atom and the energy level of a resonator that is coupled to the atom with the coupling rate g, which determines the time required to exchange the energy between the level of the atom and the energy level of the resonator. This phenomenon occurs when the resonant angular frequency of the resonator differs from the angular frequency of the corresponding transition between energy levels of the artificial atom by less than 2 g. Here, as shown in FIG. 16, an artificial atom 41, such as a transmon, a capacitively shunted flux qubit or any other anharmonic oscillator with a suitable level structure, is coupled to a harmonic oscillator 43, which in this example is an inductor-capacitor (LC) resonator, in the quantum electrodynamics framework. In order to have a system in which states $|02\rangle_{LC,A}$ and $|11\rangle_{LC,A}$ have the same energy, it is possible to tune the parameters of the transmon 41 accordingly, such that ω12=ωr. The notation $|02\rangle_{LC,A}$ here means that zero photons are present in the LC oscillator 43, while two excitations are present in the transmon 41. The notation $|11\rangle_{LC,A}$ here means that one photon is present in the LC oscillator 43, while one excitation is present in the transmon 41. Referring to FIG. 16, Cb, Cg, Cr are the capacitors, or more specifically the capacitance of the transmon 41, the coupling capacitance between the oscillator 43 and the transmon 41, and the capacitance of the oscillator 43, respectively. Lr is the oscillator inductor, or its inductance value. Ej denotes the Josephson energy, while Ec is the charging energy of the transmon 41. In this example, the coupling rate $g=(4e2/\hbar)*Cg/(Cb*Cr)$, where e is the elementary charge, and $\hbar$ is the reduced Planck's constant.

Figure 17:
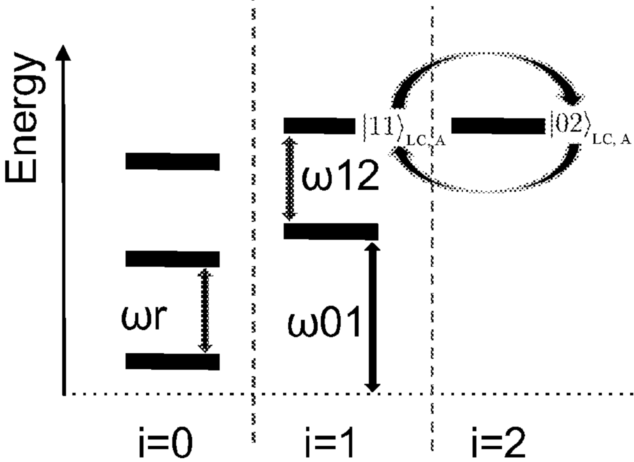
FIG. 17 shows some of the possible energy levels that may be present in the circuit of FIG. 16 as a function of a number of excitations in the artificial atom of the circuit of FIG. 16.

Only if two microwave photons are injected into the oscillator system 39 (i.e. the Rabi oscillator), the state $|11\rangle_{LC,A}$ will be populated and the Rabi oscillation will take place. Otherwise, no additional phase shift will be produced. It is to be noted that if only one photon is fed into the oscillator system 39, this delays the photon by a given amount when advancing to the oscillator system output, but this delay is smaller than the additional delay introduced by the oscillator system when two photons are present at the oscillator system inputs. Assuming that two photons are injected into the oscillator system, then one full oscillation, i.e. passage from state $|11\rangle_{LC,A}$ to state $|02\rangle_{LC,A}$ and back to state $|11\rangle_{LC,A}$, results in a π phase shift (i.e. a phase shift of 180°) of the initial state. FIG. 17 shows the energy levels of the oscillator system 39, where ωr is the resonant angular frequency of the LC oscillator 43. It corresponds to the energy needed to add one photon to the resonator 43 (i.e. the LC oscillator). ω01 and ω12 are the angular frequencies of transition between the levels 0→1 and 1→2 of the transmon qubit, respectively.

As shown in FIG. 16, the oscillator system 39 has two inputs and two outputs. One input for each coupled transmission line, and same for the outputs. The incoming photons stay in the same transmission line (left-left and right-right). The transmission lines 21 are inductively and/or capacitively coupled to the LC oscillator 43 and the artificial atom 41. One has to note that as the LC oscillator and the artificial atom have different working frequencies, the photons of each qubit (control and target) should in this case also have different frequencies. Thus the photons of different qubits do not in fact have the same frequency.

The resonator 43 and the atom 41 are quantum systems that can contain discrete amounts of energy (quantum of excitation). The energy levels of the resonator (i.e. the energy values that it can contain) are spaced linearly by ωr. The levels of the transmon, which are spaced by ω01, ω12, etc. are not linearly spaced, and the higher the energy, the smaller the energy gap between two levels. One has to tune the transmon (and the resonator) properties such that ω12=ωr, to have the $|11\rangle_{LC,A}$ and $|02\rangle_{LC,A}$ levels at the same energy. Those levels should also be isolated, i.e. no other energy level should have a similar energy.

Figures 18, 19:
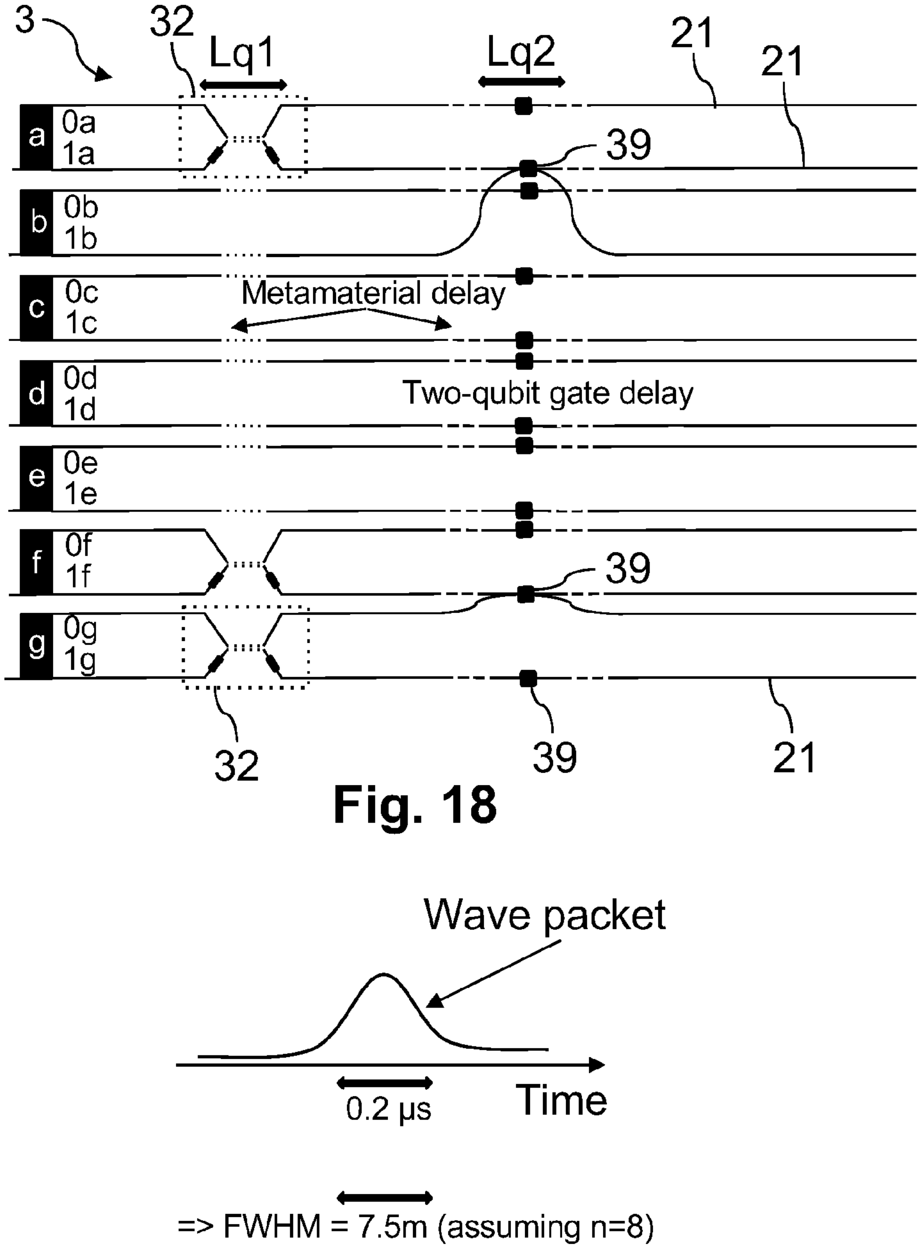
FIG. 18 illustrates an example quantum computing circuit according to the present invention and how single-qubit gates, two-qubit gates, and delay lines may be arranged in the quantum computing circuit.
FIG. 19 shows example wave-packet shapes of the microwave photons that can propagate in the quantum computing circuit of FIG. 18, and it further shows a group delay that may be present between two wave packets.

As the phase shift of the microwave photons is of great importance for the computation, every step that delays a microwave photon, except the phase shifters (including the phase shifts resulting from Rabi oscillations), are compensated for all other microwave photons in the same way. Among the compensation schemes are the length difference of the lines, the time needed to pass through directional couplers, and the time spent in a two-qubit gate. The length difference and delay due to directional couplers are compensated by the same delay imposed by metamaterial delay lines on all the other microwave photons. A delay due to a two-qubit gate 39 may be compensated by passing all the other microwave photons through a similar two-qubit gate (i.e. an artificial atom coupled to a resonator). This is schematically illustrated in FIG. 18, where the dashed line sections represent delay lines, such as metamaterial transmission line sections. It is to be noted that the two-qubit gates 39 with only one input photon act as two-qubit gate delay elements, but only the two-qubit gates 39 with two input photons add an additional delay, i.e. a phase shift with respect to the other photons.

It is to be noted that each relevant phase shift resulting from a gate represents a group delay and a phase delay. The ideal case would be the case of no group delay, but in practice it will be negligible as in space this delay is much smaller than the length of the wave packet, which constitutes a microwave photon. This is illustrated in FIG. 19. Assuming n=8 (where n is the refraction index), f=6 GHz, the carrier wavelength is $\lambda$=0.625 cm, thus air phase shift corresponds to a shift of 0.3125 cm in space of the whole pulse. Such an operation can be performed 1200 times until the two photons reach the overlapping limit of two wave packets separated by a distance which equals half of their full width at half maximum (FWHM), which is considered to still allow convenient interaction between microwave photons.

The dual-rail encoding of the flying qubits is based on one microwave photon per flying qubit, and thus it is needed to detect single microwave photons with high efficiency. At the end of the computation, single microwave photon detectors 19 are placed at the extremity of each transmission line 21. The detection of a microwave photon is a measurement in the computational basis, meaning that the qubit's state is reduced to 0 or 1. This state is then read as the outcome of the flying qubit's measurement. Thus, in the present example, a microwave photon shall always be detected, either in the first or second transmission line of a respective dual-rail transmission line element, when the measurement step happens (assuming one microwave photon was present in the respective dual-rail transmission line element). It is to be noted that the phase shift is no longer relevant in the measurement.

Figure 20:
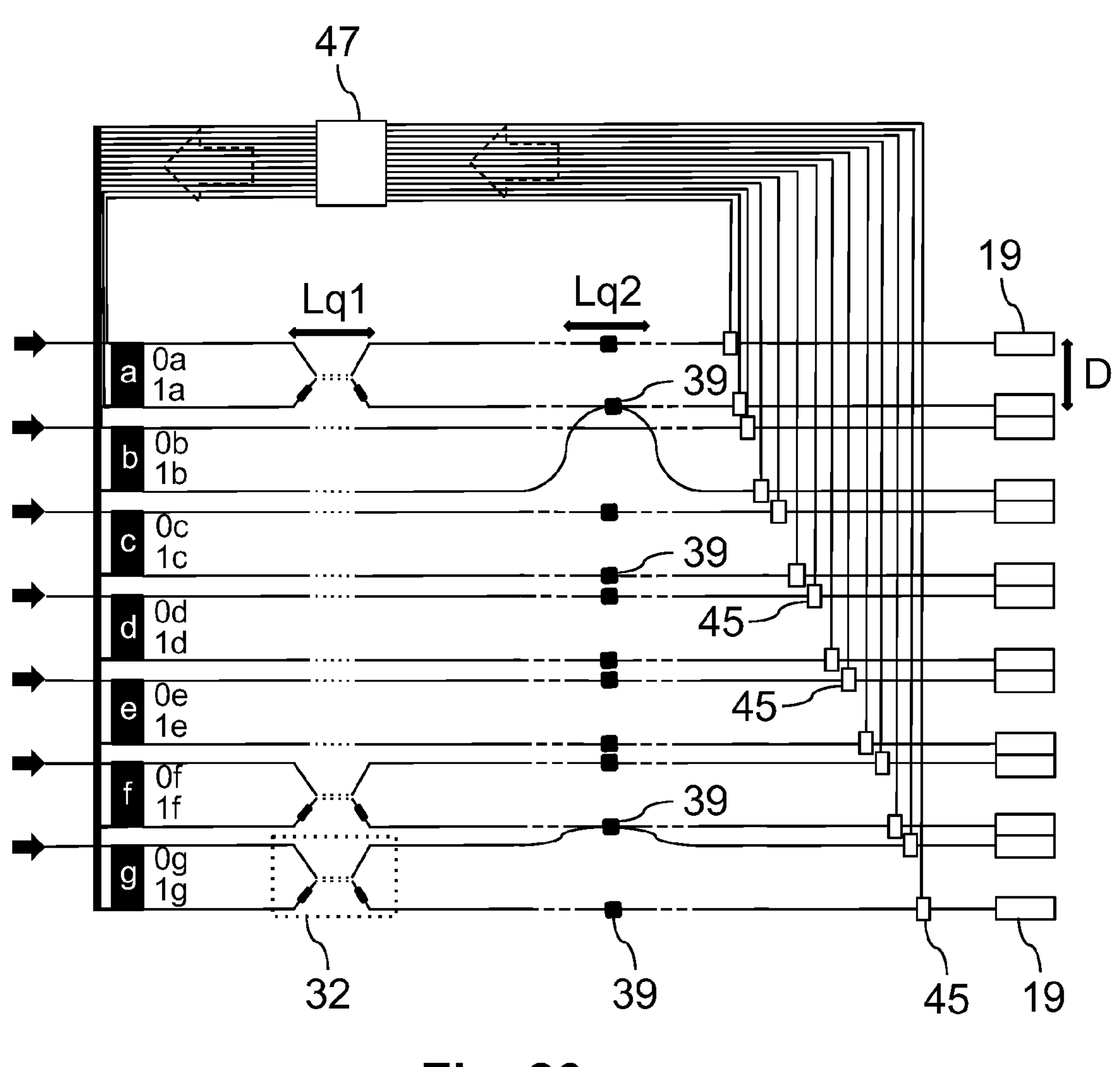
FIG. 20 shows the placement of switches and a multiplexer in an example quantum computing circuit according to the present invention.

Referring to FIG. 20, switches 45 and multiplexers 47 could be used to send microwave photons back into the quantum computing circuit 15, reusing them as the initial state of a chosen flying qubit thanks to non-destructive multiplexing. This technique could save space, allow iterations of operations on a state, and enable a dynamic selection of which operation (encoded in a given line of the circuit) to perform next. In the example configuration of FIG. 20, each transmission line comprises a switch between the two-qubit gate 39 and a microwave photon detector 19, in order to feed the photons back to the quantum computing circuit 15 if so desired, optionally through one or more multiplexers 47. Alternatively, only one or some of the transmission lines 21 are equipped with a switch. The notation D denotes the spacing between two transmission lines in a given dual rail configuration. This spacing may be e.g. between 0.1 mm and 5 mm, and more specifically between 0.3 mm and 1 mm. In this specific example, this spacing is approximately 0.5 mm, while Lq1 and Lq2 are approximately 1 mm.

Figure 21:
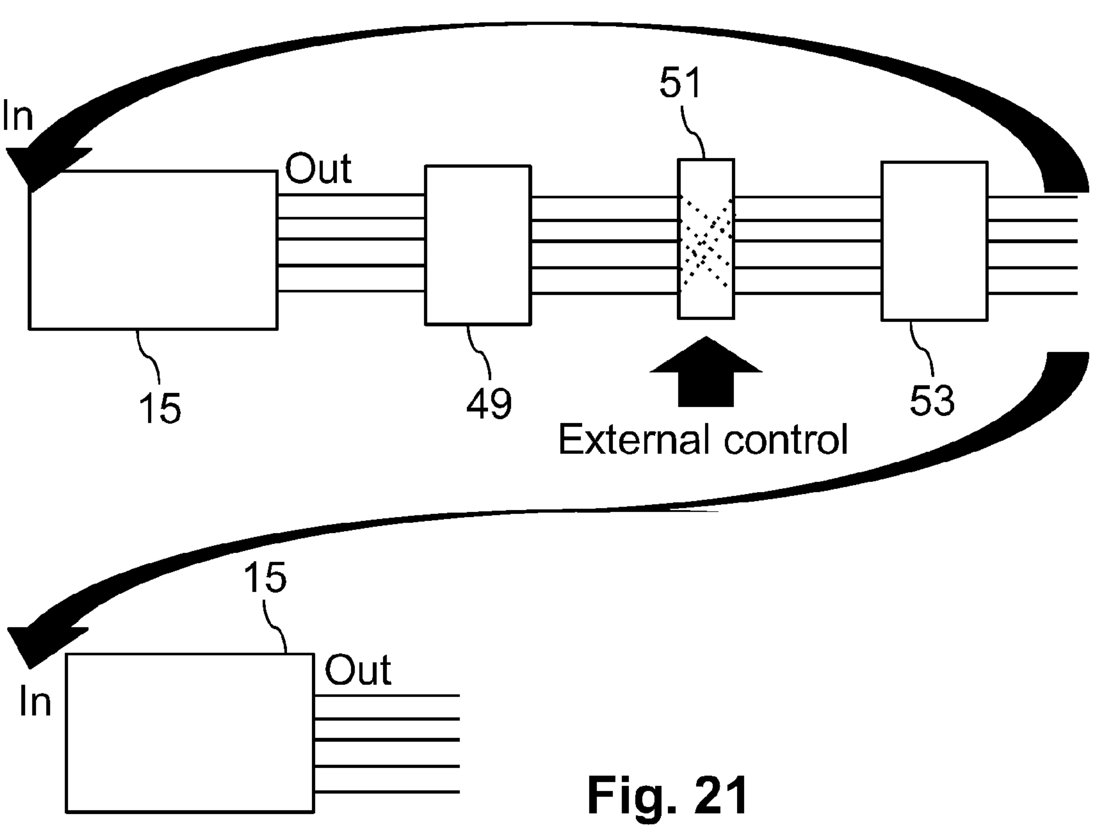
FIG. 21 demonstrates the possibility of performing microwave multiplexing using optical light in an example quantum processor according to the present invention.

Referring to FIG. 21, one possibility for implementing microwave multiplexers is to convert the microwave photons to an optical frequency domain by using one or more microwave-to-optical converters 49, which are configured to perform microwave-optical conversions. Then the multiplexing would be carried out by an optical multiplexer 51 with the optical photons, before reconverting the optical photons to a microwave domain by using one or more optical-to-microwave converters 53. The advantage of optical photon multiplexing is that it can be implemented without destroying the photonic state, with high efficiency, in a controllable way using microelectromechanical systems (MEMS) for example. It involves rerouting optical photons into optical fibres, which can be implemented at high rate using small space, and at ambient temperature with MEMS, enabling cycles of computations by sending the microwave photons in at the input ports of the chip, or to another chip. The advantages of optical multiplexing over microwave multiplexing are the small size of the multiplexer, ambient-temperature operation (out of the cryogenic environment), and the possibility of using currently existing technology. Between two cycles of computations, the important point is that the quantum state (of at least a defined subset of microwave photons) is kept unchanged (microwave photons including their correlations and phase difference). This synchronisation issue could benefit from low-loss quantum memory capable of storing photons before releasing them again.

Figure 22:
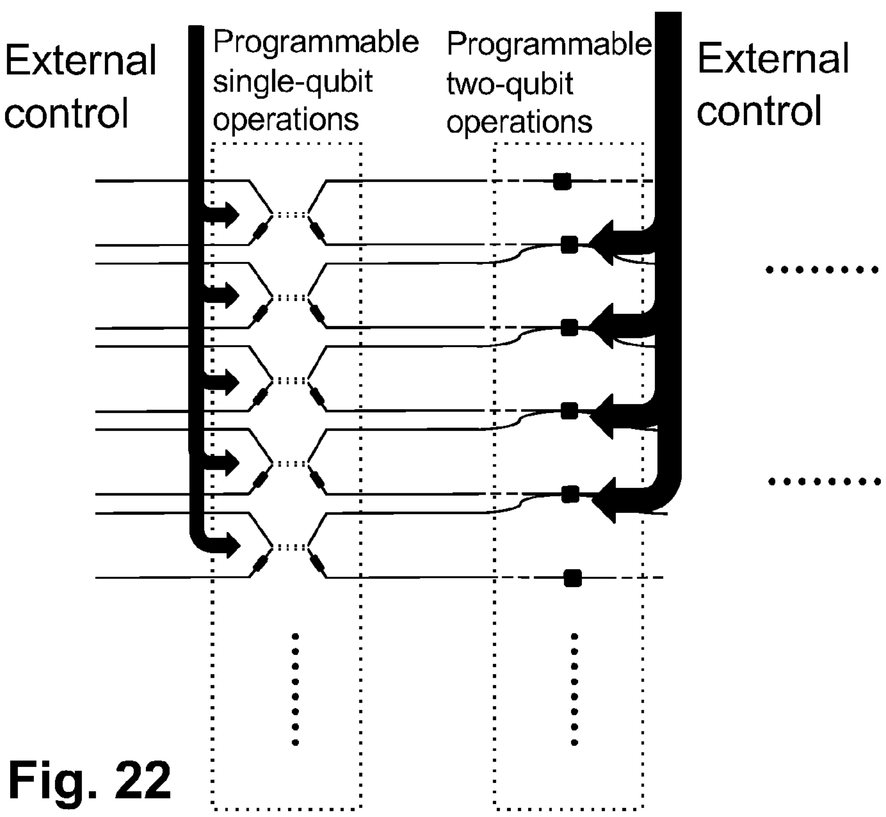
FIG. 22 illustrates the possibility of dynamically programming at least some of the quantum gates that may be used in the quantum computing circuits according to the present invention.

Optionally, it is also possible to dynamically reprogram the quantum gates 32, 39 or at least some of them as illustrated in FIG. 22. In addition to the possibility of having a circuit with fixed gates (circuit with a given purpose which always applies the same operation on the input quantum state), it is possible to reprogram the gates at will between two computation cycles. It is to be noted that one computation cycle is understood to be the passage of a respective photon through the quantum computing circuit 15 from left to right (or vice versa if the circuit input is on the right). This feature would allow the quantum circuit implemented on the chip to be changed without any hardware manipulation. Thanks to the generality of the implementation of the proposed single- and two-qubit gates (the same physical elements can be used for any quantum operation), it is possible to program any quantum circuit on a general chip. The external control may be used to choose which single-qubit and/or two-qubit operations to apply at given stages of the computation.

Figure 23:
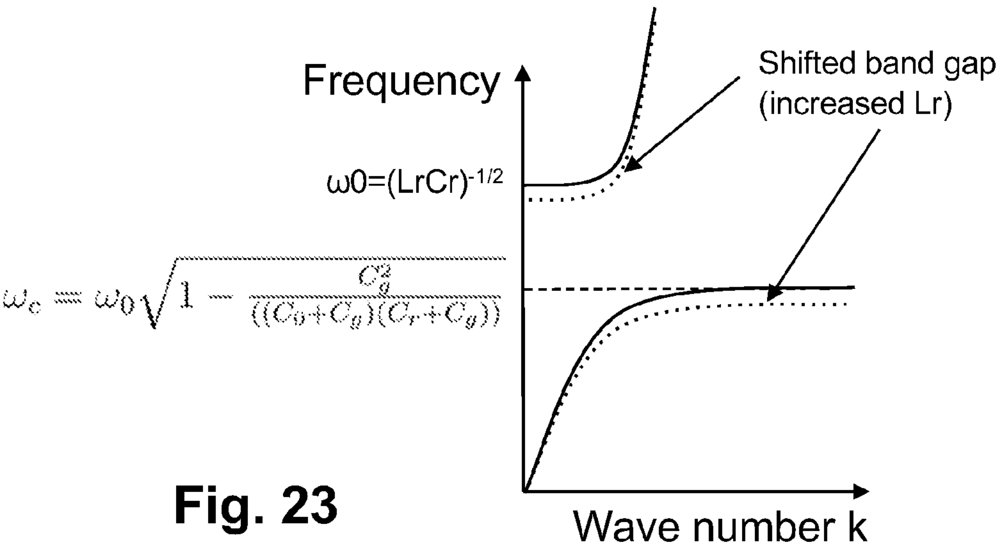
FIG. 23 shows how the metamaterial band gap can be shifted when using a modified metamaterial transmission line to build a programmable single-qubit gate.
Figure 24:
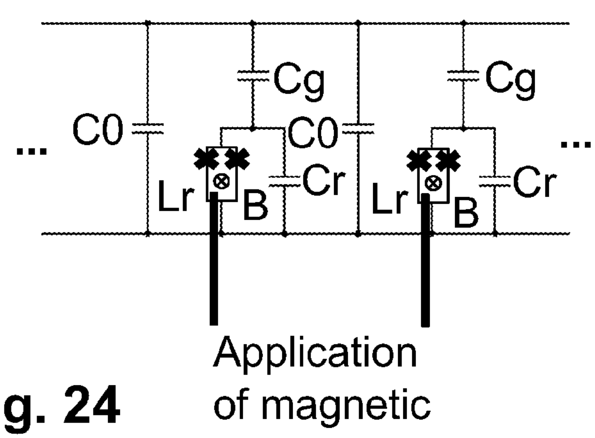
FIG. 24 shows a structure of the modified metamaterial transmission line that may be used in the programmable single-qubit gate.

Referring to FIGS. 23 and 24, according to this example, in order to change the operation a single-qubit gate is performing on a qubit, it is required to control the coupling of the directional coupler 33, as well as the phase shift of the phase shifters 35. A convenient way for this is to change the properties of a modified (new) metamaterial, used in the implementation of the directional couplers and phase shifters. The new metamaterial is the same as the one shown in FIGS. 11 and 12 except that the Josephson junctions 27 are replaced by SQUIDs. This allows the inductance Lr of the metamaterial to be dynamically tuned, by applying a magnetic flux through the SQUIDs. Changing the value of Lr in fact produces a shift of the dispersion relation (and of the bandgap) of the metamaterial, along the frequency axis. Thus, the operating frequency can be located in the band gap, or moved along the curve, resulting in continuously variable phase shift, and controllable coupling. In FIG. 23, ωc denotes the cut frequency (bottom of the band gap), ω denotes the angular frequency of the microwave photon, and ω0 denotes the resonance frequency.

Figure 25:
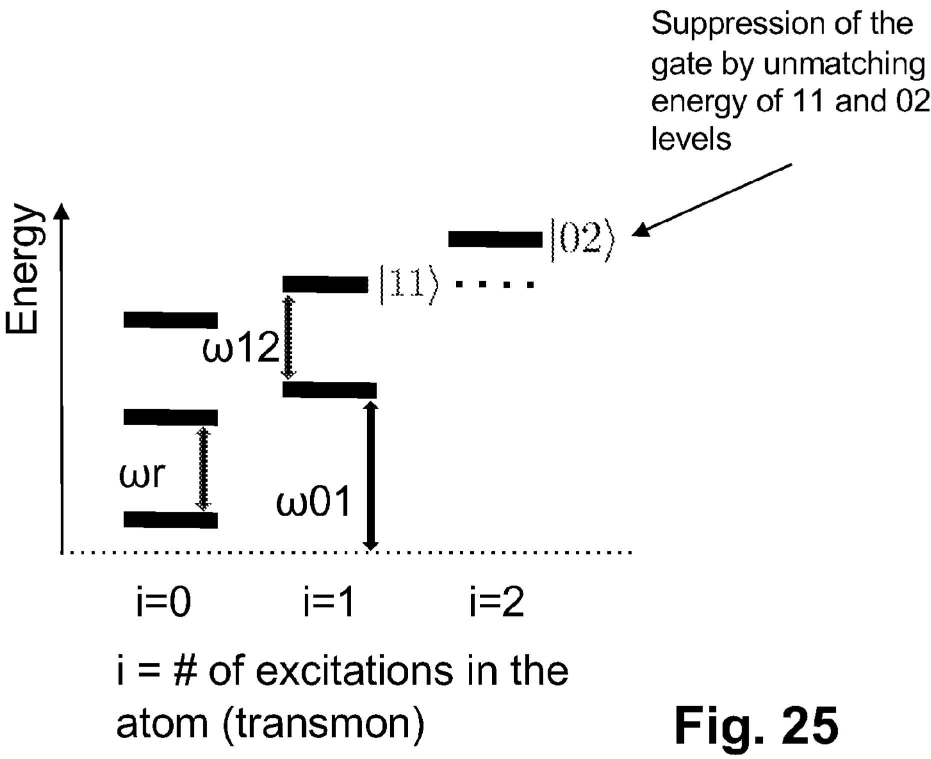
FIG. 25 shows some of the possible energy levels that may be present in the circuit of a programmable two-qubit gate and how the effect of the gate may be suppressed by having unmatched energy levels in the programmable two-qubit gate.
Figure 26:
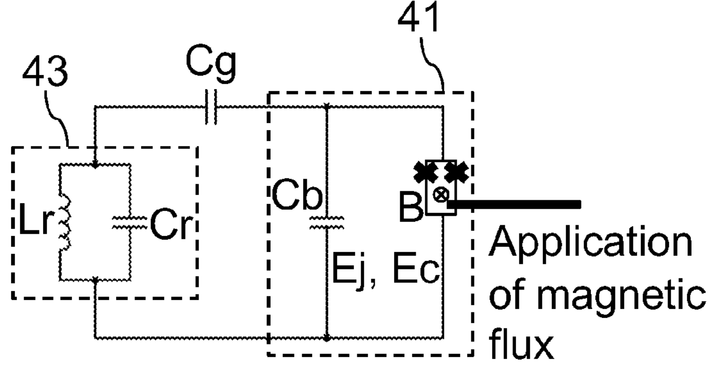
FIG. 26 is a circuit diagram representation of a programmable two-qubit gate according to the present invention.

Referring to FIGS. 25 and 26, two-qubit gates can be activated or disabled at will by dynamically changing the value of the inductance L of the transmon 41. Here again, the Josephson junction could be replaced by a SQUID, to externally change its inductance via a magnetic flux. This would directly change the structure of the energy levels of the gate, and this would result in the suppression of the effect of the gate in the case the levels $|11\rangle_{LC,A}$ and $|02\rangle_{LC,A}$ are located at different energies. Activating controlled gates at will, in addition to parameterisable single-qubit operations, would allow universal quantum computation on a single hardware unit.

The present invention may be used to implement efficient quantum computations, including quantum algorithms requiring a large number of qubits and gates. Quantum computing allows computations to be done, which reach powers that any classical computer would never have. Thus, it enables calculations which can be done exclusively with a quantum processor. Applications can be found for instance in medical research, chemistry (molecular modelling), finance, cryptography, fundamental research in physics, weather predictions, and artificial intelligence. Quantum computing will also be able to make some calculations exponentially faster compared with classical computers. Currently known quantum computers (with static qubits) are not efficient enough to be useful except when used for fundamental research. New architectures like the one proposed by the present invention help reaching efficiency sooner.

While the invention has been illustrated and described in detail in the drawings and foregoing description, such illustration and description are to be considered illustrative or exemplary and not restrictive, the invention being not limited to the disclosed embodiment. Other embodiments and variants are understood, and can be achieved by those skilled in the art when carrying out the claimed invention, based on a study of the drawings, the disclosure and the appended claims. Further embodiments may be obtained by combining any of the above teachings.

In the claims, the word "comprising" does not exclude other elements or steps, and the indefinite article "a" or "an" does not exclude a plurality. The mere fact that different features are recited in mutually different dependent claims does not indicate that a combination of these features cannot be advantageously used. Any reference signs in the claims should not be construed as limiting the scope of the invention.

The invention claimed is:

1. A quantum computing circuit for performing state operations on qubits, the quantum computing circuit comprising:

- a dual-rail structure comprising a set of dual-rail transmission-line elements, each dual-rail transmission-line element comprising a first transmission line and a second transmission line for allowing microwave photons to propagate through the first and/or second transmission lines, a respective propagating microwave photon having a specific quantum state, and encoding a qubit, the quantum state depending at least on which one of the first and second transmission lines the respective microwave photon propagates;
- a set of single-qubit gates, each single-qubit gate comprising a) a first phase shifter, a second phase shifter, and a first directional coupler, or b) a first directional coupler, a second directional coupler, and a first phase shifter, the respective phase shifter being configured to introduce a phase shift to a carrier wave of the microwave photon propagating through the respective phase shifter, the respective directional coupler being configured to transfer or partially transfer a respective microwave photon propagating through the respective single-qubit gate from the first transmission line to the second transmission line, or vice versa; and
- a set of two-qubit gates, each two-qubit gate comprising an oscillator system, the oscillator system comprising an artificial atom, an oscillator coupled to the artificial atom, two inputs and two corresponding outputs, each inputs and its corresponding output being coupled to the same transmission line of a respective dual-rail transmission-line element, two-qubit gate forms a Rabi oscillator configured to induce an additional phase-shift when two microwave photons are simultaneously received at the oscillator system, one at each of its two inputs, compared to a phase-shift induced when only a single microwave photon is received at the oscillator system.

2. The quantum computing circuit according to claim 1, wherein at least one of the first phase shifter, the second phase shifter, the first directional coupler, and the second directional coupler comprises metamaterial to reduce the wavelength of the microwave photon propagating through the respective phase shifter and/or the directional coupler.

3. The quantum computing circuit according to claim 2, wherein the metamaterial comprises electronic components, in particular the metamaterial comprises at least two conductors coupled to each other by a set of resonators, wherein the respective resonator comprises a capacitor (Cr) arranged in a parallel configuration with a one or more of Josephson junctions or one or more superinductors.

4. The quantum computing circuit according to claim 1, wherein the respective directional coupler is configured as a narrowed section of the single-qubit gate, in which the first and second transmission lines are close enough to each other for the evanescent field of the respective microwave photon propagating in one of the first and second transmission lines to be present in the other transmission line.

5. The quantum computing circuit according to claim 1, wherein the first transmission line or the second transmission line comprises the first and second phase shifters, or the first transmission line comprises one of the first and second phase shifters, while the second transmission line comprises the other phase shifter.

6. The quantum computing circuit according to claim 1, wherein the respective two-qubit gate comprises a first input coupled to a first or second transmission line of a first dual-rail transmission-line element, and a second input coupled to a first or second transmission line of a second, different dual-rail transmission-line element.

7. The quantum computing circuit according to claim 6, wherein the transmission lines coupled to the two-qubit gate cross each other, or the transmission lines are coupled to the two-qubit gate without crossing each other.

8. The quantum computing circuit according to claim 1, wherein the artificial atom is coupled to the oscillator by a coupling capacitor (Cg), and wherein the oscillator comprises a resonator inductor (Lr) in a parallel configuration with a resonator capacitor (Cr).

9. The quantum computing circuit according to claim 1, wherein the artificial atom comprises an artificial atom capacitor (Cb) in a parallel configuration with one or more Josephson junctions.

10. The quantum computing circuit according to claim 1, wherein the resonant angular frequency of the oscillator equals the angular frequency of a transition between energy levels 1 and 2 in the artificial atom or the resonant angular frequency differs from the angular frequency of a transition between energy levels 1 and 2 of the artificial atom by less than twice the coupling rate between the oscillator and the artificial atom.

11. The quantum computing circuit according to claim 1, wherein at least one of the single-qubit gates and/or at least one of the two-qubit gates is programmable, in particular at least one of the single-qubit gates and/or at least one of the two-qubit gates is programmable by a magnetic flux.

12. The quantum computing circuit according to claim 1, wherein the quantum computing circuit further comprises a set of switches and/or a set of multiplexers for selectively feeding microwave photons back to the quantum computing circuit or to another quantum computing circuit.

13. The quantum computing circuit according to claim 12, wherein the quantum computing circuit further comprises a microwave-to-optical photon converter for converting microwave photons into optical photons, and wherein at least one of the multiplexers is an optical multiplexer for multiplexing the converted optical photons.

14. A quantum processor comprising the quantum computing circuit according to claim 1, and further comprising a single microwave photon generation circuit for generating single microwave photons for the quantum computing circuit, and further comprising a microwave photon detection circuit for detecting microwave photons exiting the quantum computing circuit.

15. A method of operating the quantum processor according to claim 14, the method comprising:

substantially simultaneously feeding microwave photons from the single microwave photon generation circuit into the quantum computing circuit such that at most one microwave photon is fed per one dual-rail transmission-line element;

allowing the microwave photons to propagate through the sets of single-qubit gates and the two-qubit gates for performing state operations on the qubits propagating through the sets of first and second transmission lines; and detecting the states of the qubits at the microwave photon detection circuit.

* * * * *